US012764943B2

(12) United States Patent
Hsu et al.

(10) Patent No.: US 12,764,943 B2
(45) Date of Patent: Oct. 13, 2026

(54) SEMICONDUCTOR DEVICE AND METHOD OF MANUFACTURING THE SAME

(71) Applicant: SEMES CO., LTD., Cheonan-si (KR)

(72) Inventors: Chengyeh Hsu, Busan-si (KR); Thomas Jongwan Kwon, Seongnam-si (KR); Yunsang Kim, Seongnam-si (KR); Haewon Choi, Daejeon-si (KR)

(73) Assignee: SEMES CO., LTD., Cheonan-si (KR)

( * ) Notice: Subject to any disclaimer, the term of this patent is extended or adjusted under 35 U.S.C. 154(b) by 647 days.

(21) Appl. No.: 18/206,490

(22) Filed: Jun. 6, 2023

(65) Prior Publication Data

US 2024/0064967 A1 Feb. 22, 2024

(30) Foreign Application Priority Data

Aug. 22, 2022 (KR) ........................ 10-2022-0105071

(51) Int. Cl.
*H10B 12/00* (2023.01)

(52) U.S. Cl.
CPC ......... *H10B 12/488* (2023.02); *H10B 12/315* (2023.02); *H10B 12/482* (2023.02)

(58) Field of Classification Search
CPC .. H10B 12/482; H10B 12/315; H10B 12/488; H10B 12/033; H10B 12/05; H10B 12/02; H10B 12/30; H10B 12/0335; H10B 12/31; H10B 12/36; H10D 30/6728; H10D 30/025; H10D 30/0318; H10D 30/63; H10D 30/6735
See application file for complete search history.

(56) References Cited

U.S. PATENT DOCUMENTS 6,563,155 B2 5/2003 Miyai et al.
6,797,563 B2 9/2004 Miyai et al.
(Continued)

FOREIGN PATENT DOCUMENTS

KR 10-1996-0019730 6/1996
KR 10-0879184 1/2009
(Continued)

OTHER PUBLICATIONS

Office Action from the Korean Intellectual Property Office dated Feb. 15, 2024.
(Continued)

*Primary Examiner* — Eduardo A Rodela

(57) ABSTRACT

A semiconductor device includes bit lines each extending in a first direction on a substrate and spaced apart from each other in a second direction, semiconductor patterns disposed on each of the bit lines and including a first semiconductor pattern disposed on a first bit line, and a second semiconductor pattern arranged to be offset in the second direction from the first semiconductor pattern on the first bit line, word lines each extending in the second direction and surrounding a sidewall of each of the semiconductor patterns, the word lines including a first word line extending in the second direction and surrounding the first semiconductor pattern, and a second word line spaced apart in the first direction from the first word line and extending in the second direction while surrounding the second semiconductor pattern, and storage nodes respectively disposed on the semiconductor patterns.

17 Claims, 32 Drawing Sheets

(56) References Cited

U.S. PATENT DOCUMENTS

| | | | | |
|---|---|---|---|---|
| 8,310,864 | B2 * | 11/2012 | Lung | H10N 70/8833 365/158 |
| 8,467,220 | B2 | 6/2013 | Sim et al. | |
| 8,519,462 | B2 | 8/2013 | Wang et al. | |
| 9,177,947 | B2 * | 11/2015 | Fujimoto | H10D 1/042 |
| 11,373,914 | B2 * | 6/2022 | Calabrese | H10B 12/31 |
| 11,393,688 | B2 * | 7/2022 | Imonigie | H10B 12/05 |
| 12,137,550 | B2 * | 11/2024 | Xiao | H10D 30/6755 |
| 12,324,146 | B2 * | 6/2025 | Yeong | H10D 1/716 |
| 2011/0062504 | A1 * | 3/2011 | Hamamoto | H10B 53/30 257/295 |
| 2020/0111800 | A1 * | 4/2020 | Ramaswamy | H10B 12/033 |
| 2022/0285350 | A1 * | 9/2022 | Okajima | H10D 30/6755 |
| 2023/0371241 | A1 * | 11/2023 | Sun | H10D 30/025 |
| 2023/0413539 | A1 * | 12/2023 | Chuang | H10B 12/05 |
| 2024/0057325 | A1 * | 2/2024 | Wang | H10B 12/485 |
| 2024/0098973 | A1 * | 3/2024 | Liu | H10B 12/50 |

FOREIGN PATENT DOCUMENTS

| | | |
|---|---|---|
| KR | 10-0891249 | 4/2009 |
| KR | 10-1140079 | 4/2012 |
| KR | 10-2014-0144960 | 12/2014 |
| KR | 10-1550519 | 9/2015 |
| KR | 10-2022-0090208 | 6/2022 |

OTHER PUBLICATIONS

Highly scalable 4F2 cell transistor for future DRAM technology, K. Min et al., Jun. 2020.

Novel 4F2 DRAM Cell with Vertical Pillar Transistor (VPT), Hyun-Woo Chung, Oct. 2011.

* cited by examiner

SEMICONDUCTOR DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0105071, filed on Aug. 22, 2022, in the Korean Intellectual Property Office, the disclosure of which is incorporated by reference herein in its entirety.

BACKGROUND

1. Field

The disclosure relates to a semiconductor device and a method of manufacturing the semiconductor device.

2. Description of the Related Art

According to the trend of high capacity and miniaturization of electronic devices, high capacity and miniaturization of memory devices have been required. In particular, a dynamic random-access memory (DRAM) device include a buried channel array arranged within a substrate and a cell capacitor connected to the buried channel array. However, the buried channel array has a relatively large unit cell area of, for example, $6F^2$, a process for forming a word line within a substrate, and gate-induced drain leakage (GIDL) occurs.

SUMMARY

The disclosure provides a semiconductor device including a vertical channel transistor having a reduced unit cell area and reduced leakage current, and a method of manufacturing the semiconductor device.

Additional aspects will be set forth in part in the description that follows and, in part, will be apparent from the description, or may be learned by practice of the embodiments of the disclosure.

According to an embodiment of the disclosure, a semiconductor device includes a plurality of bit lines each extending in a first direction on a substrate and spaced apart from each other in a second direction perpendicular to the first direction, a plurality of semiconductor patterns disposed on each of the plurality of bit lines, the plurality of semiconductor patterns including a first semiconductor pattern disposed on a first bit line from among the plurality of bit lines, and a second semiconductor pattern arranged to be offset in the second direction from the first semiconductor pattern on the first bit line, a plurality of word lines each extending in the second direction and surrounding a sidewall of each of the plurality of semiconductor patterns, the plurality of word lines including a first word line extending in the second direction and surrounding the first semiconductor pattern, and a second word line spaced apart in the first direction from the first word line and extending in the second direction while surrounding the second semiconductor pattern, and a plurality of storage nodes respectively disposed on the plurality of semiconductor patterns.

In a plan view, the plurality of semiconductor patterns may be arranged in a hexagonal array.

The plurality of word lines may have a pitch of 2F in the second direction, each of the plurality of bit lines may have a first width of 1.74F in the first direction, and the plurality of bit lines may be spaced apart from each other at a first interval of 0.58F in the first direction.

The plurality of semiconductor patterns may have a unit cell area of $4.64F^2$.

Each of the plurality of word lines may include a main gate portion surrounding the semiconductor pattern, and a connection gate portion disposed between two main gate portions adjacent to each other in the second direction, the connection gate portion being connected to the two main gate portions.

In a plan view, the main gate portion of the first word line may be arranged to be offset in the first direction and the second direction from the main gate portion of the second word line.

An upper surface of the main gate portion and an upper surface of the connection gate portion may be coplanar with each other, and an upper surface of each of the plurality of semiconductor patterns may be disposed at a lower vertical level than the upper surface of the main gate portion.

The semiconductor device may further include a plurality of gate insulating layer between the plurality of word lines and the plurality of semiconductor patterns, wherein each of the plurality of gate insulating layer structures includes a first dielectric layer surrounding a sidewall of each of the plurality of semiconductor patterns and having an upper surface at a higher level than an upper surface of each of the plurality of semiconductor patterns, and a second dielectric layer surrounding the sidewall of each of the plurality of semiconductor patterns on the first dielectric layer, and having an upper surface at a lower level than the upper surface of each of the plurality of semiconductor patterns.

The first dielectric layer may include a silicon oxide, and the second dielectric layer may include a high-k dielectric material having a greater dielectric constant than the silicon oxide.

The semiconductor device may further include an insulating liner disposed on an upper side of the sidewall of each of the plurality of semiconductor patterns, the insulating liner including an air space therein, wherein the air space is arranged between the main gate portion and the first dielectric layer.

Each of the plurality of storage nodes may include a lower electrode disposed on upper surfaces of the plurality of semiconductor patterns and extending in a third direction perpendicular to an upper surface of the substrate, an upper electrode surrounding the lower electrode, and a capacitor dielectric layer located between the lower electrode and the upper electrode, and a bottom surface of the lower electrode is disposed at a lower level than an upper surface of the main gate portion.

A sidewall of a bottom portion of the lower electrode may be covered by the insulating liner.

According to an embodiment of the disclosure, a semiconductor device includes a plurality of bit lines each extending in a first direction on a substrate and spaced apart from each other in a second direction perpendicular to the first direction, a plurality of semiconductor patterns disposed on each of the plurality of bit lines and arranged in a hexagonal array, the plurality of semiconductor patterns including a plurality of first semiconductor patterns disposed on a first bit line from among the plurality of bit lines and located at a first distance from a first sidewall of the first bit line, and a plurality of second semiconductor patterns located at a second distance that is greater than the first distance from the first sidewall on the first bit line, a plurality of word lines each extending in the second direction and surrounding a sidewall of each of the plurality of semiconductor patterns, and a plurality of storage nodes respectively disposed on the plurality of semiconductor patterns.

The plurality of word lines may have a pitch of 2F in the second direction, each of the plurality of bit lines may have a first width of 1.74F in the first direction, the plurality of bit lines may be spaced apart from each other at a first interval of 0.58F in the first direction, and the plurality of semiconductor patterns may have a unit cell area of $4.64F^2$.

The plurality of semiconductor patterns may include at least one of silicon, silicon-germanium, silicon carbide, gallium arsenide, indium phosphide, indium oxide, indium gallium oxide, indium zinc gallium oxide, and aluminum indium gallium oxide.

The semiconductor device may further include a plurality of gate insulating layer structures located between the plurality of word lines and the plurality of semiconductor patterns, and an insulating liner disposed on an upper side of the sidewall of each of the plurality of semiconductor patterns, the insulating liner including an air space therein, wherein each of the plurality of word lines includes a main gate portion surrounding the semiconductor pattern, and a connection gate portion disposed between two main gate portions adjacent to each other in the second direction, the connection gate portion being connected to the two main gate portions, and each of the plurality of gate insulating layer structures includes a first dielectric layer surrounding the sidewall of each of the plurality of semiconductor patterns and having an upper surface at a higher level than an upper surface of each of the plurality of semiconductor patterns, and a second dielectric layer surrounding the sidewall of each of the plurality of semiconductor patterns on the first dielectric layer, and having an upper surface at a lower level than the upper surface of each of the plurality of semiconductor patterns.

An upper surface of the main gate portion and an upper surface of the connection gate portion may be coplanar with each other, and the upper surface of each of the plurality of semiconductor patterns may be disposed at a lower vertical level than the upper surface of the main gate portion.

Each of the plurality of storage nodes may include a lower electrode directly disposed on upper surfaces of the plurality of semiconductor patterns and extending in a third direction perpendicular to an upper surface of the substrate, an upper electrode surrounding the lower electrode, and a capacitor dielectric layer located between the lower electrode and the upper electrode, a bottom surface of the lower electrode may be disposed at a lower level than an upper surface of the main gate portion, and a sidewall of a bottom portion of the lower electrode may be covered by the insulating liner.

A semiconductor device includes a plurality of bit lines each extending in a first direction on a substrate and spaced apart from each other in a second direction perpendicular to the first direction, a plurality of semiconductor patterns disposed on each of the plurality of bit lines and arranged in a hexagonal array, the plurality of semiconductor patterns including a plurality of first semiconductor patterns disposed on a first bit line from among the plurality of bit lines and located at a first distance from a first sidewall of the first bit line, and a plurality of second semiconductor patterns located at a second distance that is greater than the first distance from the first sidewall on the first bit line, a plurality of word lines each extending in the second direction and surrounding a sidewall of each of the plurality of semiconductor patterns, a plurality of gate insulating layers located between the plurality of word lines and the plurality of semiconductor patterns, an insulating liner disposed on an upper side of the sidewall of each of the plurality of semiconductor patterns, the insulating liner including an air space therein, and a plurality of storage nodes respectively disposed on the plurality of semiconductor patterns, the plurality of storage nodes including a lower electrode, a capacitor dielectric layer, and an upper electrode, wherein a sidewall of a bottom portion of the lower electrode is covered by the insulating liner.

Each of the plurality of word lines may include a main gate portion surrounding the semiconductor pattern, and a connection gate portion disposed between two main gate portions adjacent to each other in the second direction, the connection gate portion being connected to the two main gate portions, each of the plurality of gate insulating layer structures includes a first dielectric layer surrounding the sidewall of each of the plurality of semiconductor patterns and having an upper surface at a higher level than an upper surface of each of the plurality of semiconductor patterns, and a second dielectric layer surrounding the sidewall of each of the plurality of semiconductor patterns on the first dielectric layer, and having an upper surface at a lower level than the upper surface of each of the plurality of semiconductor patterns, and the insulating liner is located between the main gate portion and the first dielectric layer.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 15A to 25 are diagrams illustrating a method of manufacturing a semiconductor device, according to embodiments, according to a process order. Specifically, FIGS. 15A, 16A, 17A, 19A, and 20A are top views corresponding to region A in FIG. 1, FIGS. 15B, 16B, 17B, 18, 19B, 20B, 23, 24, and 25 correspond to cross-sectional views taken along line B1-B1' in FIG. 15A, and FIGS. 19C, 20C, 21, and 22 correspond to cross-sectional views taken along line B2-B2' in FIG. 19A.

DETAILED DESCRIPTION

Figure 1:
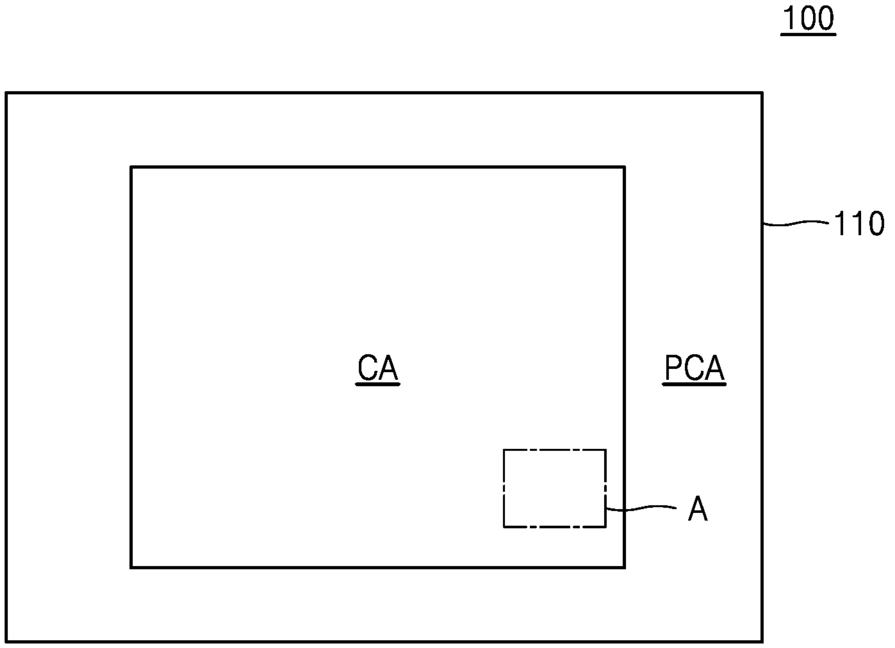
FIG. 1 is a diagram schematically illustrating a semiconductor device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure are described in detail with reference to the accompanying drawings. In the drawings, the same reference symbols denote the same elements, and redundant descriptions thereof are omitted.

Figure 2:
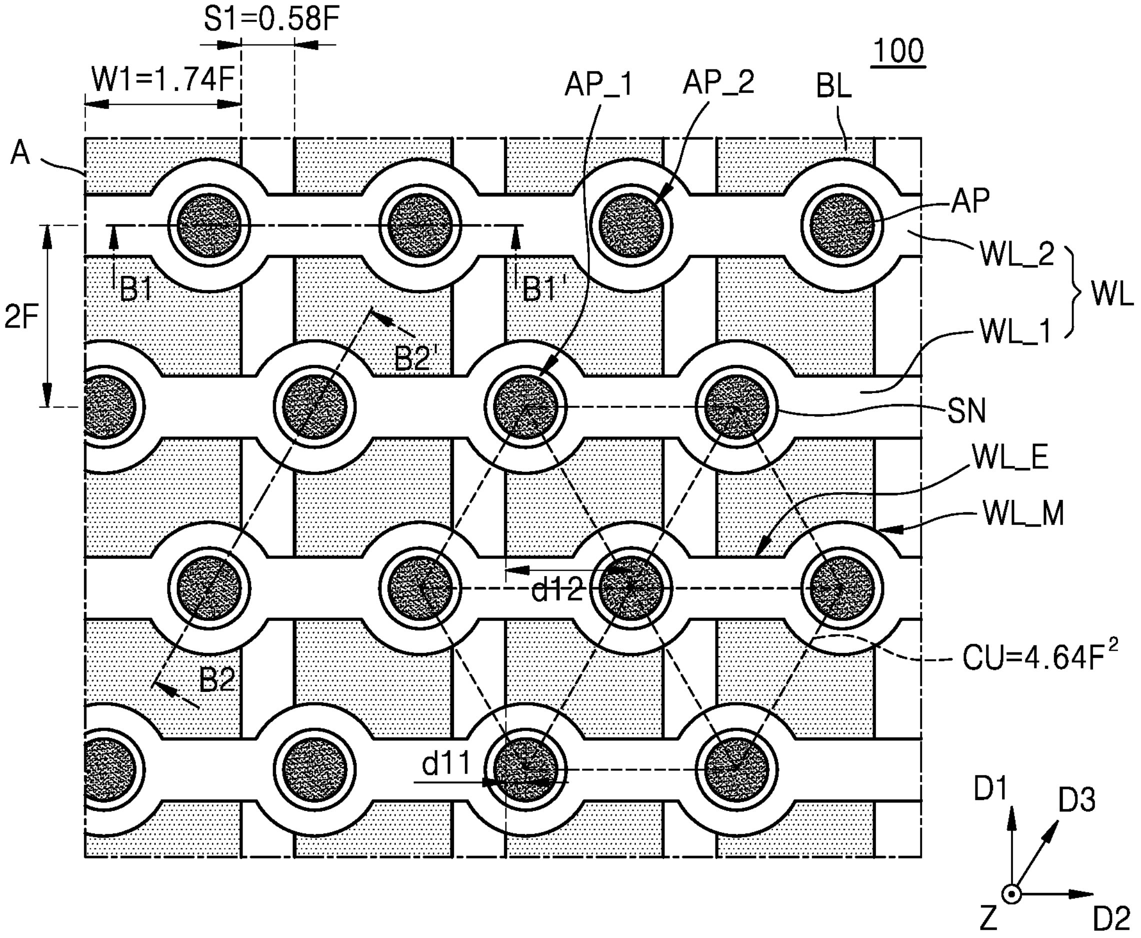
FIG. 2 is an enlarged diagram of region A in FIG. 1.
Figure 3:
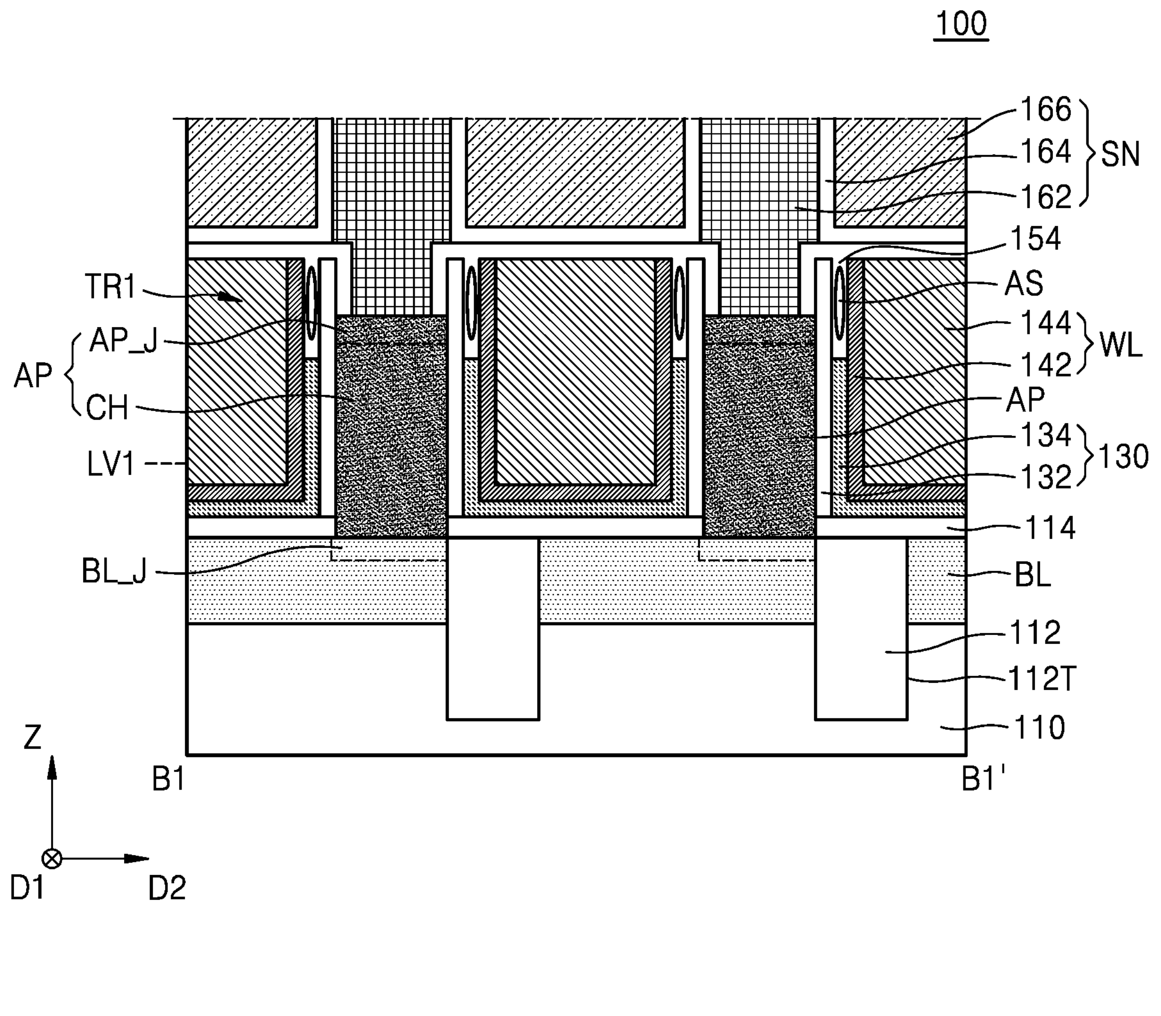
FIG. 3 is a cross-sectional view taken along line B1-B1' in FIG. 2.
Figure 4:
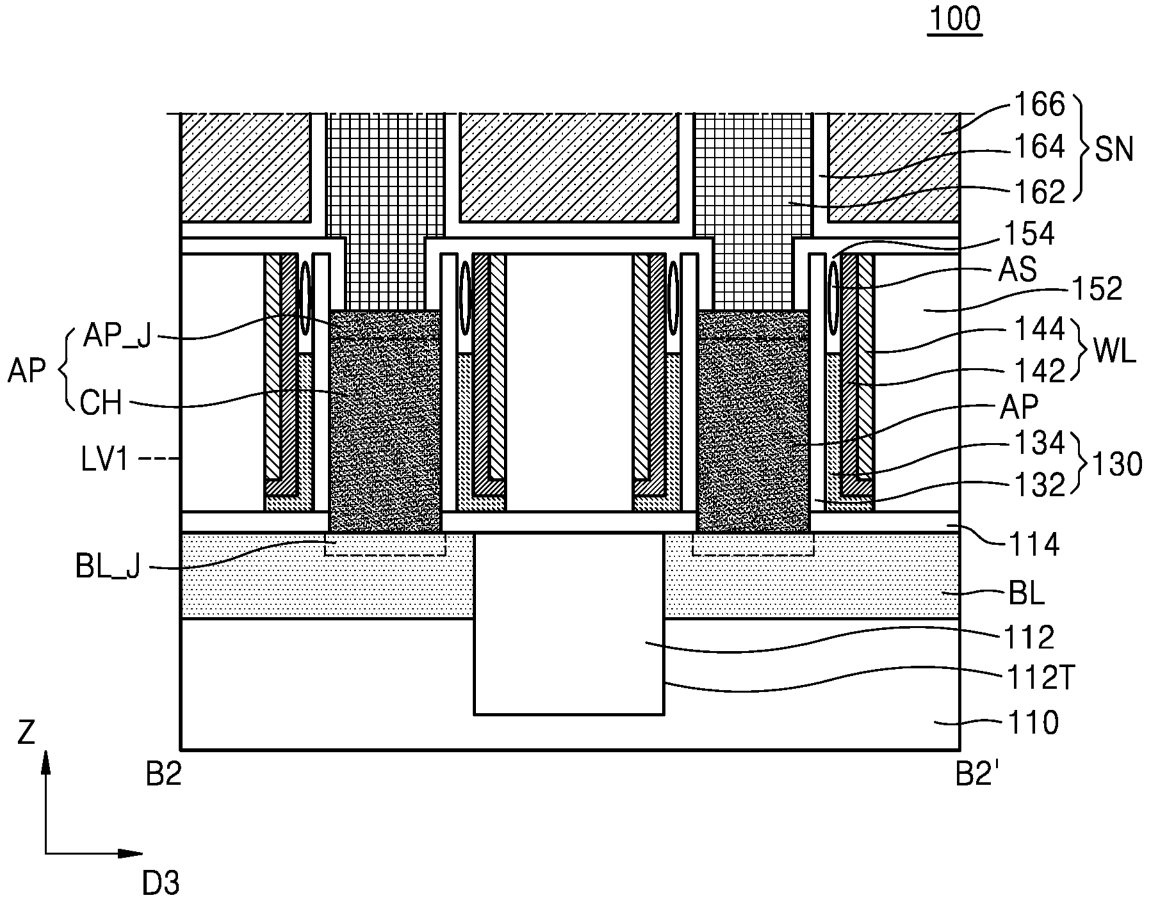
FIG. 4 is a cross-sectional view taken along line B2-B2' in FIG. 2.
Figure 5:
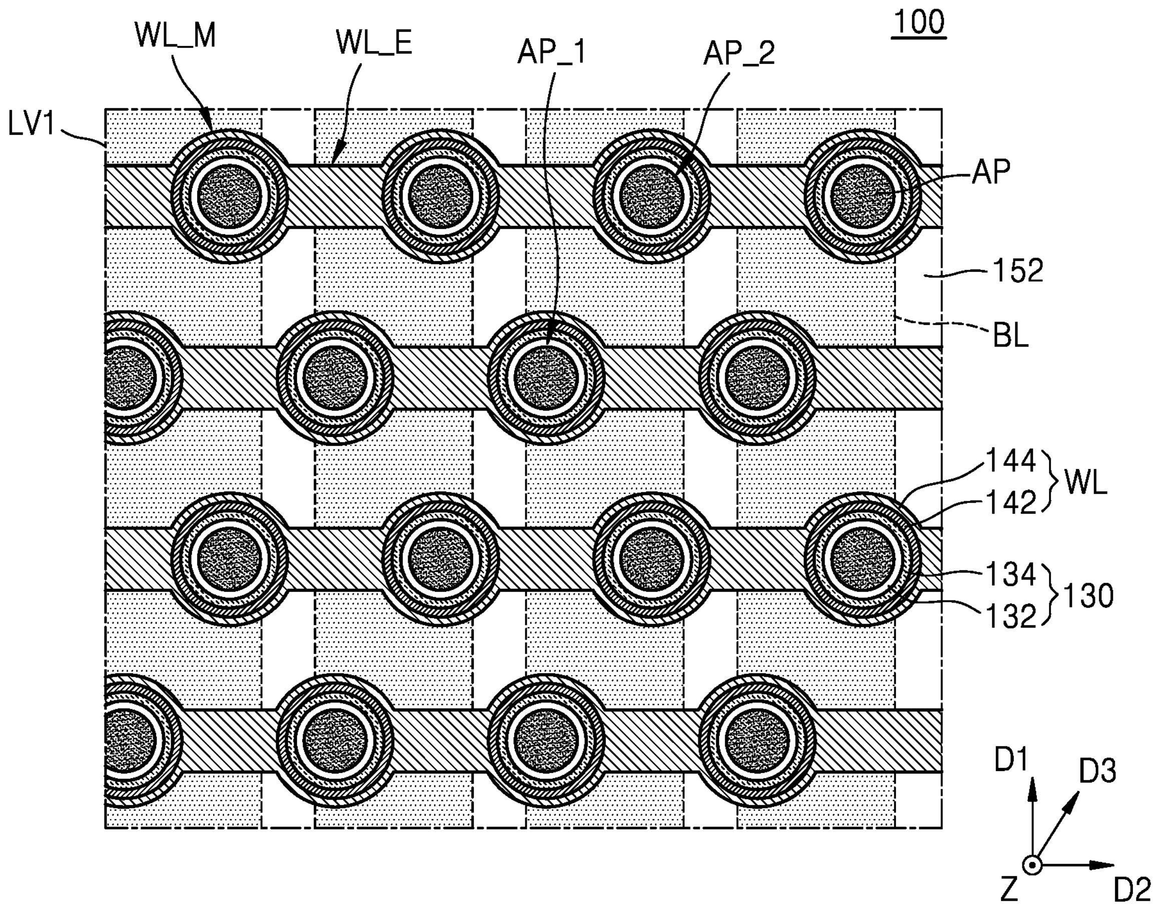
FIG. 5 is a horizontal cross-sectional view at a first vertical level of FIG. 3.

FIG. 1 is a schematic layout view of a semiconductor device 100 according to an embodiment, and FIG. 2 is an enlarged layout diagram of region A in FIG. 1. FIG. 3 is a cross-sectional view taken along line B1-B1' in FIG. 2, FIG. 4 is a cross-sectional view taken along line B2-B2' in FIG. 2, and FIG. 5 is a horizontal cross-sectional view at a first horizontal level LV1 in FIG. 3.

Referring to FIGS. 1 to 5, the semiconductor device 100 may include a memory cell area CA disposed on a substrate 110, and a peripheral circuit area PCA surrounding the memory cell area CA.

The substrate 110 may include a semiconductor substrate including silicon, silicon-germanium, silicon carbide, or the like. In some embodiments, the substrate 110 may have a silicon-on-insulator structure.

The memory cell area CA may be an area in which a dynamic random-access memory (DRAM) element is formed. In some embodiments, the memory cell area CA may include a vertical channel transistor TR1, and a storage node SN of a capacitor type connected onto the vertical channel transistor TR1. The memory cell area CA may be an area in which a DRAM element of a 1 transistor-1 capacitor (1T-1C) structure, in which the vertical channel transistor TR1 and the storage node SN are connected to each other.

The peripheral circuit area PCA may be an area in which a driving transistor, which is for driving a DRAM element formed in the memory cell area CA, an input/output element, and the like are formed. In some embodiments, the peripheral circuit area PCA may include a peripheral circuit transistor (not shown) included in a sense amplifier, a row decoder, a column decoder, a control logic circuit, or an input/output gate circuit. In embodiments, the peripheral circuit transistor may be a planar transistor disposed on the substrate 110.

In the memory cell area CA, a plurality of bit lines BL on the substrate 110 may each extend in a first horizontal direction D1 and may be arranged to be spaced apart from each other in a second horizontal direction D2 that is perpendicular to the first horizontal direction D1. In some embodiments, as shown in FIG. 3, each of the plurality of bit lines BL may include a conductive layer (not shown) formed by a chemical vapor deposition (CVD) process, an atomic layer deposition (ALD) process, or the like, on an upper surface of the substrate 110. In some other embodiments, the plurality of bit lines BL may be a partial area of the substrate 110 formed by heavily doping n-type impurities from the upper surface of the substrate 110 to a certain depth. For example, the plurality of bit lines BL may include doped silicon or doped silicon-germanium.

In embodiments, the plurality of bit lines BL may each have a first width W1 in the second horizontal direction D2 and may be arranged to be spaced apart from each other by a first distance S1 in the second horizontal direction D2. For example, when F corresponds to a unit feature size, the first width W1 may correspond to about 1.74F, and the first distance S1 may correspond to about 0.58F.

On the substrate 110, each of a plurality of element isolation trench 112T may be arranged to extend in the first horizontal direction D1, and a plurality of element isolation layers 112 may be arranged in the plurality of element isolation trench 112T. In some embodiments, the element isolation layer 112 may have an upper surface at the same level at which an upper surface of the bit line BL is located. In some embodiments, the element isolation layer 112 may include a silicon oxide, a silicon nitride, a silicon oxynitride, or a combination thereof.

A buffer insulating layer 114 may be disposed on the plurality of bit lines BL and the element isolation layer 112. The buffer insulating layer 114 may include a silicon oxide, a silicon nitride, a silicon oxynitride, or a combination thereof. In embodiments, the buffer insulating layer 114 may include a double-layer structure of a silicon oxide layer and a silicon nitride layer.

A plurality of semiconductor patterns AP may be disposed on the plurality of bit lines BL by passing through the buffer insulating layer 114. Each of the plurality of semiconductor patterns AP may extend in a horizontal direction (Z) on the upper surfaces of the plurality of bit lines BL. The plurality of semiconductor patterns AP may include a channel area CH extending to a relatively large length in the horizontal direction (Z), and a junction area AP_J arranged at a vertical level higher than a vertical level of the channel area CH on the upper side of the plurality of semiconductor patterns AP. The junction area AP_J may be an area formed by doping impurities from the upper surfaces of the plurality of semiconductor patterns AP to a certain depth, and may be an area functioning as a source/drain area of the vertical channel transistor TR1.

In some embodiments, a junction area BL_J may further be formed at an upper portion of the plurality of bit lines BL disposed under the semiconductor pattern AP. For example, the junction area BL_J may be an area formed by doping impurities from the upper surfaces of the plurality of bit lines BL to a certain depth, and may be an area functioning as a source/drain area of the vertical channel transistor TR1. However, in other embodiments, the junction area BL_J may not be formed at the upper portion of the plurality of bit lines BL, but may be formed at a lower portion of the plurality of semiconductor patterns AP at a higher level than the upper surfaces of the plurality of bit lines BL.

In embodiments, as shown in FIG. 2, the plurality of semiconductor patterns AP may be arranged in a hexagonal array, in a plan view. As shown in FIG. 2, the plurality of semiconductor patterns AP may include a plurality of first semiconductor patterns AP_1 and a second semiconductor pattern AP_2. For example, the plurality of first semiconductor patterns AP_1 may be arranged to be spaced apart from each other by a certain distance in the second horizontal distance D2, and the plurality of second semiconductor patterns AP_2 may be arranged to be spaced apart from the plurality of first semiconductor patterns AP_1 in a third horizontal direction D3. For example, the third horizontal direction D3 may extend in a diagonal direction between the first horizontal direction D1 and the second horizontal direction D2, and in some embodiments, the third horizontal direction D3 may be inclined by about 30 degrees from the first horizontal direction D1. In other words, the plurality of second semiconductor patterns AP_2 may be arranged to be spaced apart or offset from the plurality of first semiconductor patterns AP_1 in both the first horizontal direction D1 and the second horizontal direction D2.

On one bit line BL, both one first semiconductor pattern AP_1 and a second semiconductor pattern AP_2 that is offset from the one first semiconductor pattern AP_1 in the first horizontal direction D1 and the second horizontal direction D2 may be disposed. For example, as shown in FIG. 2, a center of the first semiconductor pattern AP_1 may have a first distance d11 from a sidewall of one bit line BL in the second horizontal direction D2, and a center of the second semiconductor pattern AP_2 may have a second distance d12, which is greater than the first distance d11, in the second horizontal direction D2 from one sidewall of the one bit line BL.

The plurality of first semiconductor patterns AP_1 may be arranged at a pitch corresponding to about 2.32F. For example, a distance between the centers of two first semiconductor patterns AP_1 that are adjacent to each other in the second horizontal direction D2 from among the plurality of first semiconductor patterns AP_1 may correspond to about 2.32F. In addition, the first semiconductor pattern AP_1 and the second semiconductor pattern AP_2 arranged to be adjacent to each other in the third horizontal direction D3 may be arranged at a pitch corresponding to about 2.32F. For example, a distance between the centers of the first semiconductor pattern AP_1 and the second semiconductor pattern AP_2 arranged to be adjacent to each other in the third horizontal direction D3 may correspond to about 2.32F.

In some embodiments, each of the plurality of semiconductor patterns AP may include a semiconductor material, such as silicon, silicon-germanium, silicon carbide, gallium arsenide, indium phosphide, or the like. For example, each of the plurality of semiconductor patterns AP may include single-crystal silicon or single-crystal silicon-germanium. In some other embodiments, each of the plurality of semiconductor patterns AP may include an oxide semiconductor, such as an indium oxide, an indium gallium oxide, an indium zinc gallium oxide, or an aluminum indium gallium oxide, but is not limited thereto.

In some other embodiments, each of the plurality of semiconductor patterns AP may include silicon, and may be formed by an epitaxy growth process using an upper surface portion of the bit line BL not covered by the buffer insulating layer 114 as a seed layer.

In FIG. 2, each of the plurality of semiconductor patterns AP has a circular horizontal cross-section. However, the horizontal cross-sectional shape of each of the plurality of semiconductor patterns AP is not limited thereto. Each of the plurality of semiconductor patterns AP may have a horizontal cross-sectional shape, such as an ellipse, a quadrangle with round edges, a rectangle with round edges, a square with round edges, a hexagon, or the like.

A gate insulating layer structure 130 may be disposed on sidewalls of the plurality of semiconductor patterns AP. The gate insulating layer structure 130 may include a first dielectric layer 132 and a second dielectric layer 134. The first dielectric layer 132 may be in contact with the sidewalls of the plurality of semiconductor patterns AP and may extend in the vertical direction (Z) to a level higher than the upper surface of each of the plurality of semiconductor patterns AP. The second dielectric layer 134 may surround each of the sidewalls of the plurality of semiconductor patterns AP with the first dielectric layer 132 therebetween, and may have an upper surface at a level lower than an upper surface of the first dielectric layer 132 and lower than each of the upper surfaces of the plurality of semiconductor patterns AP. In some embodiments, as shown in FIG. 3, the second dielectric layer 134 may extend from the sidewall of the semiconductor pattern AP onto the upper surface of the buffer insulating layer 114.

In embodiments, the first dielectric layer may include a silicon oxide, and the second dielectric layer 134 may include a high-k dielectric material. The high-k dielectric material may indicate a material having a dielectric constant that is greater than that of a silicon oxide. In embodiments, the second dielectric layer 134 may include a hafnium oxide, a zirconium oxide, a titanium oxide, an aluminum oxide, a lanthanum oxide, a hafnium silicon oxide, a zirconium silicon oxide, a titanium silicon oxide, an aluminum silicon oxide, a hafnium zirconium oxide, a zirconium aluminum oxide, a hafnium lanthanum oxide, a titanium zirconium aluminum oxide, or a combination thereof.

Each of a plurality of word lines WL may extend in the second horizontal direction D2 by surrounding the sidewalls of the plurality of semiconductor patterns AP, and the gate insulating layer structure 130 may be located between the plurality of word lines WL and the plurality of semiconductor patterns AP.

The plurality of word lines AL may include a plurality of first word lines WL_1 and a plurality of second word lines WL_2, which are alternately arranged with each other in the first horizontal direction D1. Each of the first word lines WL_1 may surround the plurality of first semiconductor patterns AP_1 arranged in a line in the second horizontal direction D2, and each of the second word lines WL_2 may surround the plurality of second semiconductor patterns AP_2 arranged in a line in the second horizontal direction D2.

In embodiments, the plurality of word lines WL may include a main gate portion WL_M surrounding the plurality of semiconductor patterns AP, and a connection gate portion WL_E arranged between two adjacent main gate portions WL_M and connected to the two adjacent main gate portions WL_M. As shown in FIG. 2, the main gate portions WL_M may be arranged in a hexagonal array, and the connection gate portion WL_E may have a line shape extending in the second horizontal direction D2.

The word line WL may include a work function adjustment layer 142 disposed on the gate insulating layer structure 130, and a gate electrode layer 144 disposed on the work function adjustment layer 142. In embodiments, the work function adjustment layer 142 may include titanium (Ti), tantalum (Ta), titanium nitride (TiN), tantalum nitride (TaN), tungsten nitride (WN), titanium carbide (TiC), tantalum carbide (TaC), titanium aluminide (TiAl), tantalum aluminide (TaAl), titanium aluminum carbide (TiAlC), tantalum aluminum carbide (TaAlC), titanium aluminum nitride (TiAlN), hafnium aluminide (HfAl), hafnium aluminum carbide (HfAlC), tungsten silicide (WSi), titanium silicide (TiSi), hafnium silicide (HfSi), or a combination thereof. In embodiments, the gate electrode layer 144 may include tungsten (W), aluminum (Al), Ti, cobalt (Co), an alloy thereof, or a combination thereof.

The plurality of word lines WL may have a gate-all-around (GAA) structure surrounding the sidewall of each of the plurality of semiconductor patterns AP, and thus, the vertical channel transistor TR1 may have a relatively low leakage current. Furthermore, in a plan view, the plurality of word lines WL may have a structure including the main gate portion WL_M having a relatively large width and the connection gate portion WL_E having a relatively small width, and may be arranged at a pitch corresponding to about 2F in the first horizontal direction D1.

As the plurality of semiconductor patterns AP are arranged in a hexagonal array and the plurality of word lines WL are arranged at a relatively small pitch of 2F, the vertical channel transistor TR1 may be arranged to have a unit cell area CU of $4.64F^2$. Accordingly, the vertical channel transistor TR1 may have a relatively small unit cell area CU, and may be advantageous for high integration.

In embodiments, an upper surface of the main gate portion WL_M may be at the same vertical level at which an upper surface of the connection gate portion WL_E is disposed. The plurality of word lines WL may have an upper surface at a higher level than a level of the upper surfaces of the plurality of semiconductor patterns AP, and in addition, the plurality of word lines WL may have an upper surface at a higher vertical level than a level of the upper surface of the second dielectric layer 134.

An inter-gate insulating layer 152 may be formed between two adjacent word lines WL from among the plurality of word lines WL. The inter-gate insulating layer 152 may include a silicon oxide, a silicon nitride, a silicon oxynitride, or a low-k (low dielectric constant) dielectric material. For example, the low-k dielectric material may include SiOC, SiOCH, SiCN, SiOCN, SiBN, SiBCN, or a combination thereof, but is not limited thereto. In some other embodiments, the inter-gate insulating layer 152 may include an air space therein.

An insulating liner 154 may be disposed on the plurality of word lines WL and the inter-gate insulating layer 152, and a portion of the insulating liner 154 may extend in the horizontal direction Z to fill a space between the word line WL and the first dielectric layer 132. In addition, another portion of the insulating liner 154 may extend in the vertical direction (Z) on the inner wall of the first dielectric layer 132 and be in contact with an edge of the upper surface of each of the plurality of semiconductor patterns AP.

As shown in FIG. 3, an air space AS may be arranged inside the insulating liner 154 arranged between the word line WL and the first dielectric layer 132. The air space AS may denote an empty space, a void, or a seam inside the insulating liner 154 such that air or gas may be included in the insulating liner 154. The air space AS may be formed at a location vertically overlapping the second dielectric layer 134, and may be arranged in a space defined by an outer wall of the first dielectric layer 132, the upper surface of the second dielectric layer 134, and the inner wall of the work function adjustment layer 142 (for example, a second recess space 134R formed by a pull-back process of the second dielectric layer 134 (see FIG. 18)).

In embodiments, the insulating liner 154 may include a silicon nitride or silicon oxynitride. In embodiments, the insulating liner 154 may be formed by using a material having poor step coverage, and in a process of forming the insulating liner 154 in the second recess space 134 that is relatively narrow, when the inside of the second recess space 134R is not completely filled, the entrance of the second recess space 134R is blocked, and thus, the air space AS may be formed inside the insulating liner 154.

The storage node SN may be disposed on the insulating liner 154. The storage node SN may include a lower electrode 162, a capacitor dielectric layer 164, and an upper electrode 166.

In embodiments, the lower electrode 162 may be arranged in a hexagonal array on the upper portion of each of the plurality of semiconductor patterns AP. The lower electrode 162 may be directly disposed on the upper surface of each of the plurality of semiconductor patterns AP, and may be electrically connected to the junction area AP_J. A sidewall of a bottom portion of the lower electrode 162 may be surrounded by the insulating liner 154, and a bottom surface of the lower electrode 162 may be disposed at a lower vertical level than the upper surface of the word line WL.

In embodiments, the lower electrode 162 may be in contact with the plurality of semiconductor patterns AP in a self-aligned manner, and in a plan view, the lower electrode 162 may be surrounded by the air space AS. For example, because the air space AS may be arranged between the lower electrode 162 and the word line WL, electric coupling caused by a relatively high voltage may be prevented from occurring.

The capacitor dielectric layer 164 may conformally cover a sidewall of the lower electrode 162 and may extend onto the upper surface of the insulating liner 154. The upper electrode 166 may cover the lower electrode 162 on the capacitor dielectric layer 164.

In embodiments, each of the lower electrode 162 and the upper electrode 166 may include Ti, Ta, niobium, ruthenium, TiN, TaN, niobium nitride, ruthenium nitride, tungsten, WN, doped polysilicon, doped silicon-germanium, or a combination thereof. The capacitor dielectric layer 164 may include a hafnium oxide, zirconium oxide, titanium oxide, aluminum oxide, lanthanum oxide, hafnium silicon oxide, zirconium silicon oxide, titanium silicon oxide, aluminum silicon oxide, hafnium zirconium oxide, zirconium aluminum oxide, hafnium lanthanum oxide, titanium zirconium aluminum oxide, or a combination thereof.

In FIG. 3, the storage node SN is of a capacitor type. However, the disclosure is not limited thereto. The storage node SN may include one of a phase change memory element including a phase change material layer, a magnetic memory element including a magnetic tunnel junction pattern, and a variable resistance memory element including a variable resistance material layer.

In general, a DRAM device has a structure including a buried channel array arranged in a substrate and a cell capacitor connected to the buried channel array. However, the buried channel array transistor has a relatively large unit cell area of, for example, about 6 $F^2$, a process for forming a word line in the substrate is complicated, and GIDL occurs.

However, according to the embodiments described above, when the plurality of semiconductor patterns AP are arranged in a hexagonal array, the vertical channel transistor TR1 may have a reduced unit cell area of $4.64F^2$. In addition, because the word line WL has a GAA structure surrounding all sidewalls of the plurality of semiconductor patterns AP, GIDL may be significantly reduced or prevented.

Furthermore, because the lower electrode 162 is in contact with the semiconductor pattern AP in a self-aligned manner and the air space AS is arranged between the lower electrode 162 and the word line WL, electric coupling caused by a relatively high voltage applied to the lower electrode 162 may be prevented.

Figure 6:
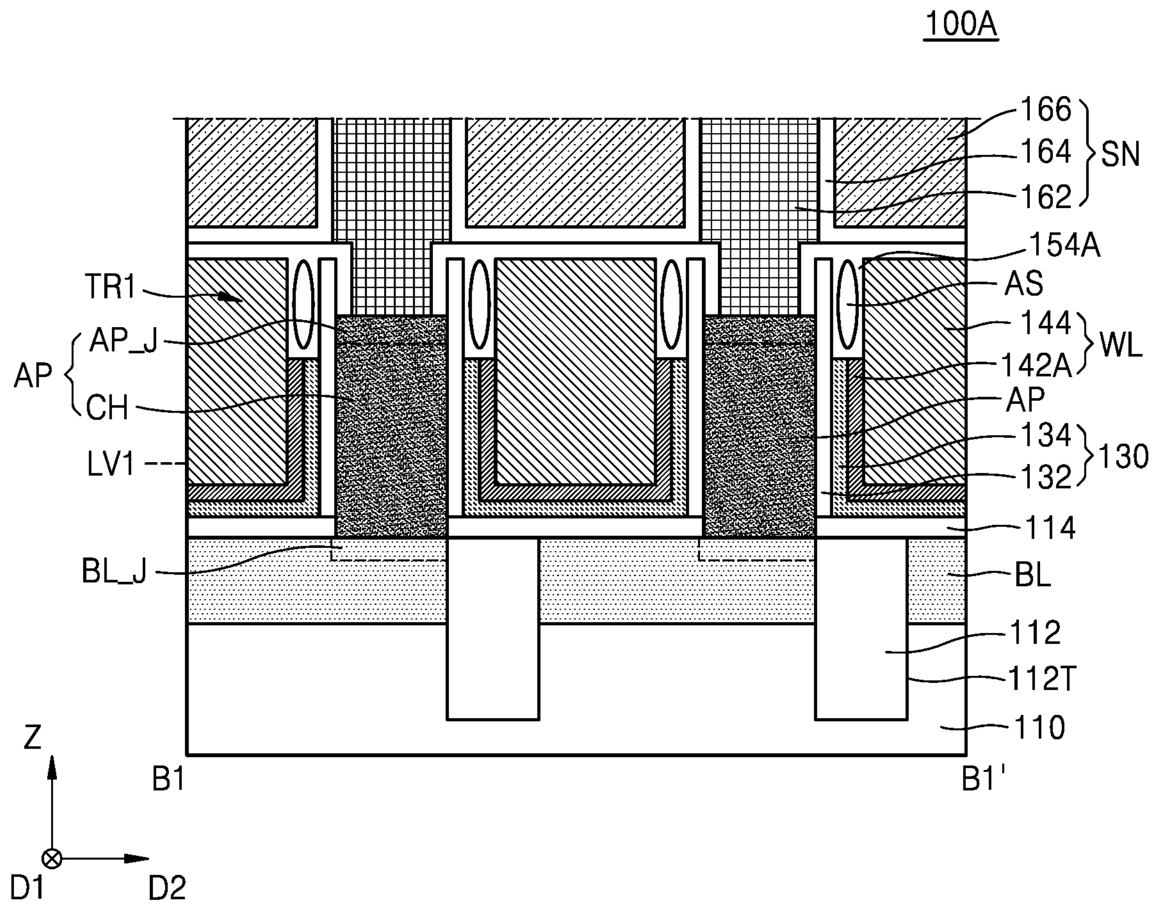
FIGS. 6 and 7 are cross-sectional views illustrating a semiconductor device according to embodiments.
Figure 7:
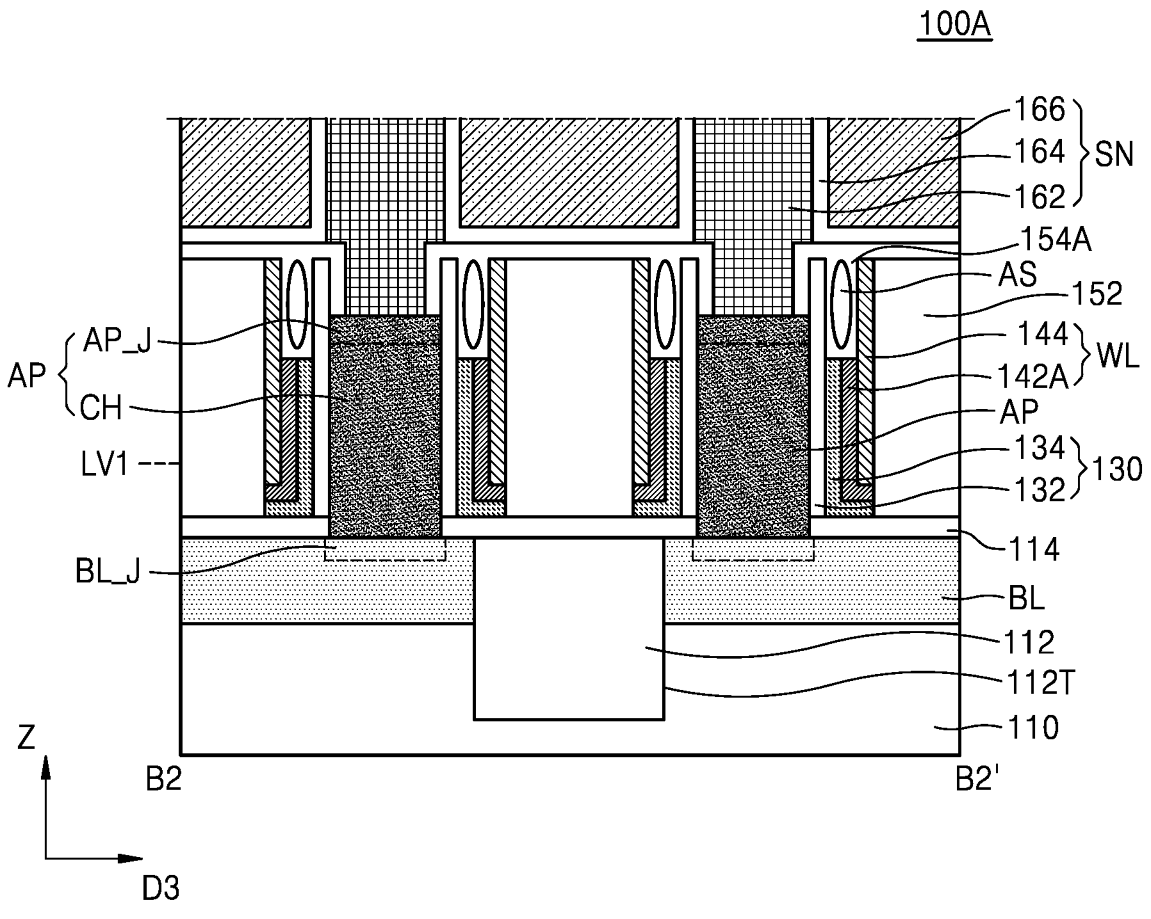

FIGS. 6 and 7 are cross-sectional views illustrating a semiconductor device 100A according to embodiments. FIG. 6 corresponds to a cross-section taken along line B1-B1' in FIG. 2, and FIG. 7 corresponds to a cross-section taken along line B2-B2' in FIG. 2. In FIGS. 6 and 7, the same reference symbols as those of FIGS. 1 to 5 denote the same elements.

Referring to FIGS. 6 and 7, a work function adjustment layer 142A may have an upper surface at a vertical level lower than a vertical level of the upper surface of the gate electrode layer 144. For example, as shown in FIG. 6, an upper surface of the work function adjustment layer 142A and the upper surface of the second dielectric layer may be coplanar. In other embodiments, the upper surface of the work function adjustment layer 142A may be disposed at a vertical level that is higher than the upper surface of the second dielectric layer 134 and lower than the upper surface of the gate electrode layer 144. In other embodiments, the upper surface of the work function adjustment layer 142A may be disposed at a vertical level that is lower than the upper surface of the second dielectric layer 134.

The insulating liner 154A may be disposed on the inner wall of a space formed by the inner wall of the gate electrode layer 144, the upper surface of the work function adjustment layer 142A, the upper surface of the second dielectric layer 134, and the outer wall of the first dielectric layer 132, and the air space AS may be arranged inside the insulating liner 154A. For example, the air space AS may be arranged at a location vertically overlapping the work function adjustment layer 142A and the second dielectric layer 134. The air space AS may be formed in a space provided by removing upper portions of the work function adjustment layer 142A and/or the second dielectric layer 134, and may have a relatively large volume.

According to embodiments, because the air space AS is arranged between the sidewall of the bottom portion of the lower electrode 162 and the word line WL (for example, between the sidewall of the bottom portion of the lower electrode 162 and the gate electrode layer 144), electric coupling caused by a relatively high voltage applied to the lower electrode 162 may be prevented.

Figure 8:
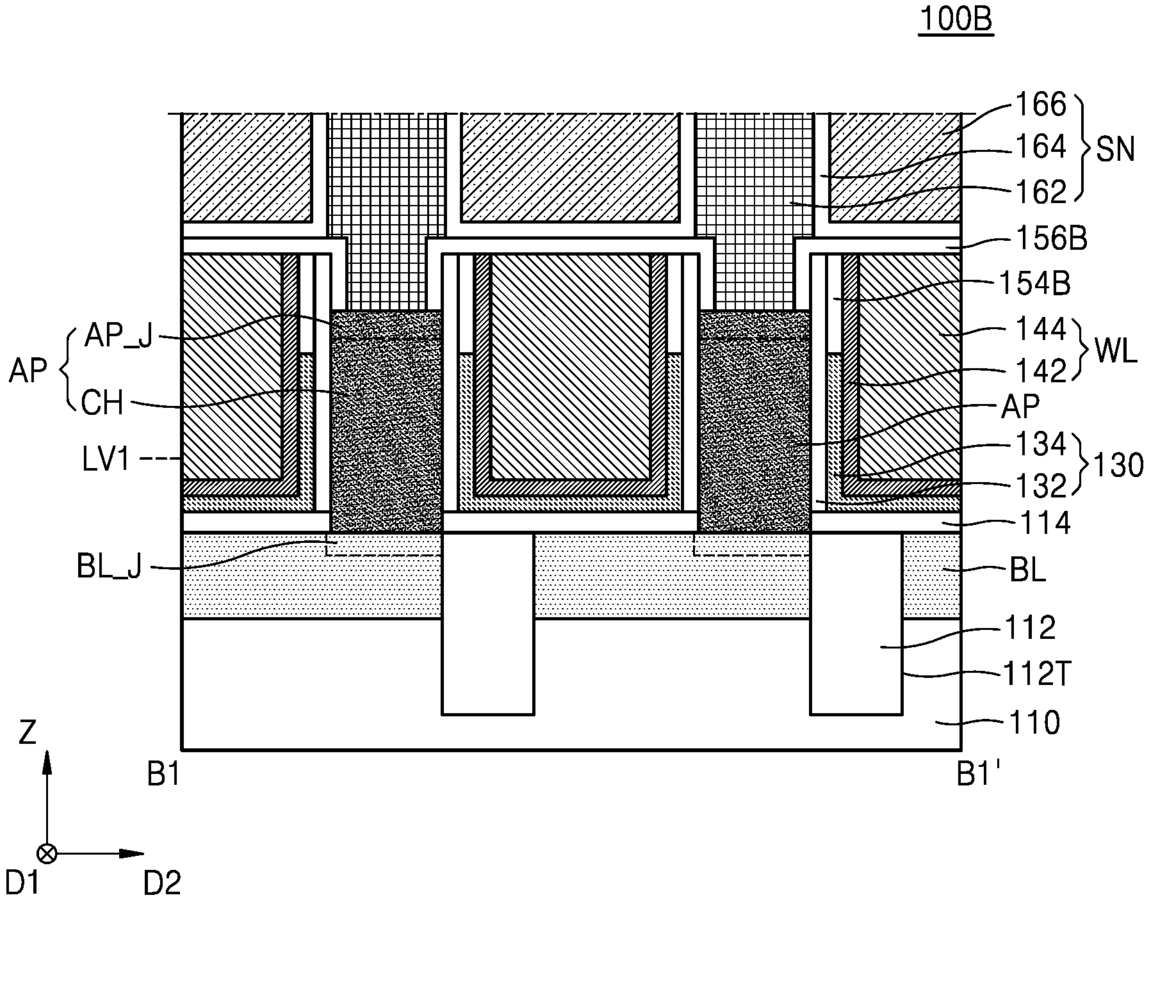
FIGS. 8 and 9 are cross-sectional views illustrating a semiconductor device according to embodiments.
Figure 9:
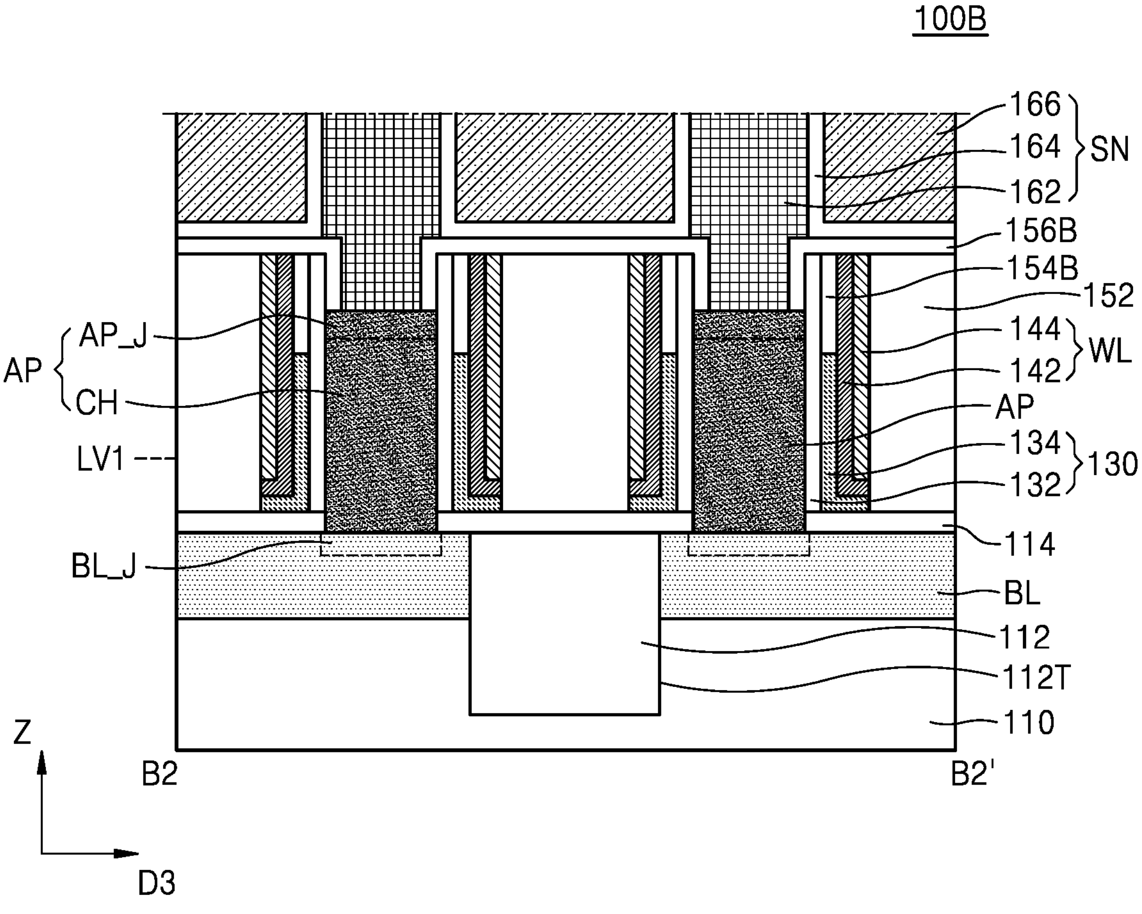

FIGS. 8 and 9 are cross-sectional views illustrating a semiconductor device 100B according to embodiments. FIG. 8 corresponds to a cross-section taken along line B1-B1' in FIG. 2, and FIG. 9 corresponds to a cross-section taken along line B2-B2' in FIG. 2. In FIGS. 8 and 9, the same reference symbols as those of FIGS. 1 to 7 denote the same elements.

Referring to FIGS. 8 and 9, an insulating liner 154B is arranged between the gate insulating layer structure 130 and the word line WL, and an etch stop layer 156B may be disposed on the upper surface of the word line WL. For example, the insulating liner 154B may fill a space defined by the outer wall of the first dielectric layer 132, the upper surface of the second dielectric layer 134, and the inner wall of the work function adjustment layer 142, and for example, may be arranged to vertically overlap the second dielectric layer 134. The insulating liner 154B may include a low-k (low dielectric constant) dielectric material. For example, the low-k dielectric material may include SiOC, SiOCH, SiCN, SiOCN, SiBN, SiBCN, or a combination thereof, but is not limited thereto. The insulating liner 154B may not include an air space therein.

In some embodiments, the insulating liner 154B may include the same material as the inter-gate insulating layer 152, and for example, may be simultaneously formed in a process in which the inter-gate insulating layer 152 is formed. In other embodiments, the insulating liner 154B may include a material different from a material included in the inter-gate insulating layer 152, and for example, may be formed after a process of forming the inter-gate insulating layer 152 is performed.

The etch stop layer 156B may be conformally formed on the word line WL and the inter-gate insulating layer 152, and may extend in a vertical direction along the inner wall of the first dielectric layer 132 to be in contact with the upper surface of each of the plurality of semiconductor patterns AP. In embodiments, the etch stop layer 156B may include a silicon nitride or silicon oxynitride.

According to embodiments, because the insulating liner 154B is arranged between the sidewall of the bottom portion of the lower electrode 162 and the word line WL, electric coupling caused by a relatively high voltage applied to the lower electrode 162 may be prevented.

Figure 10:
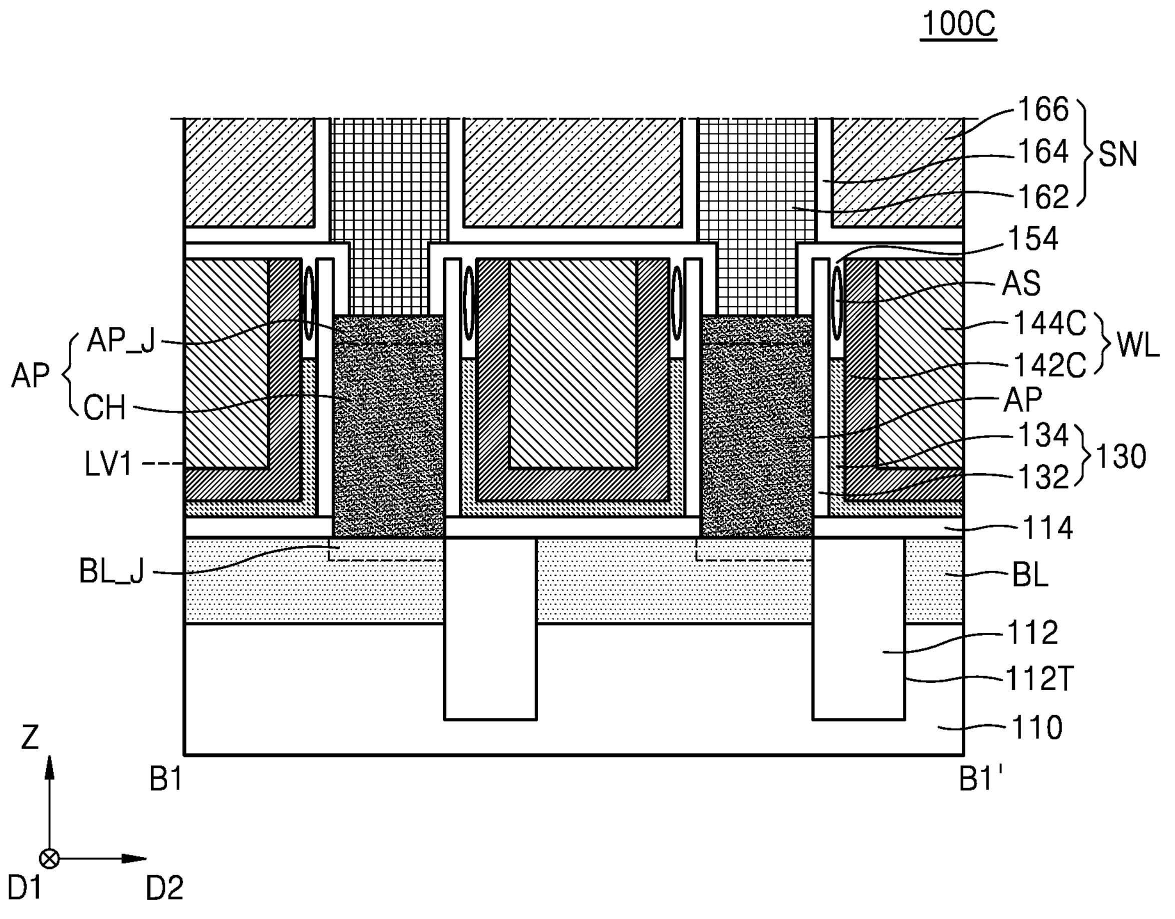
FIGS. 10 and 11 are cross-sectional views illustrating a semiconductor device according to embodiments.
Figure 11:
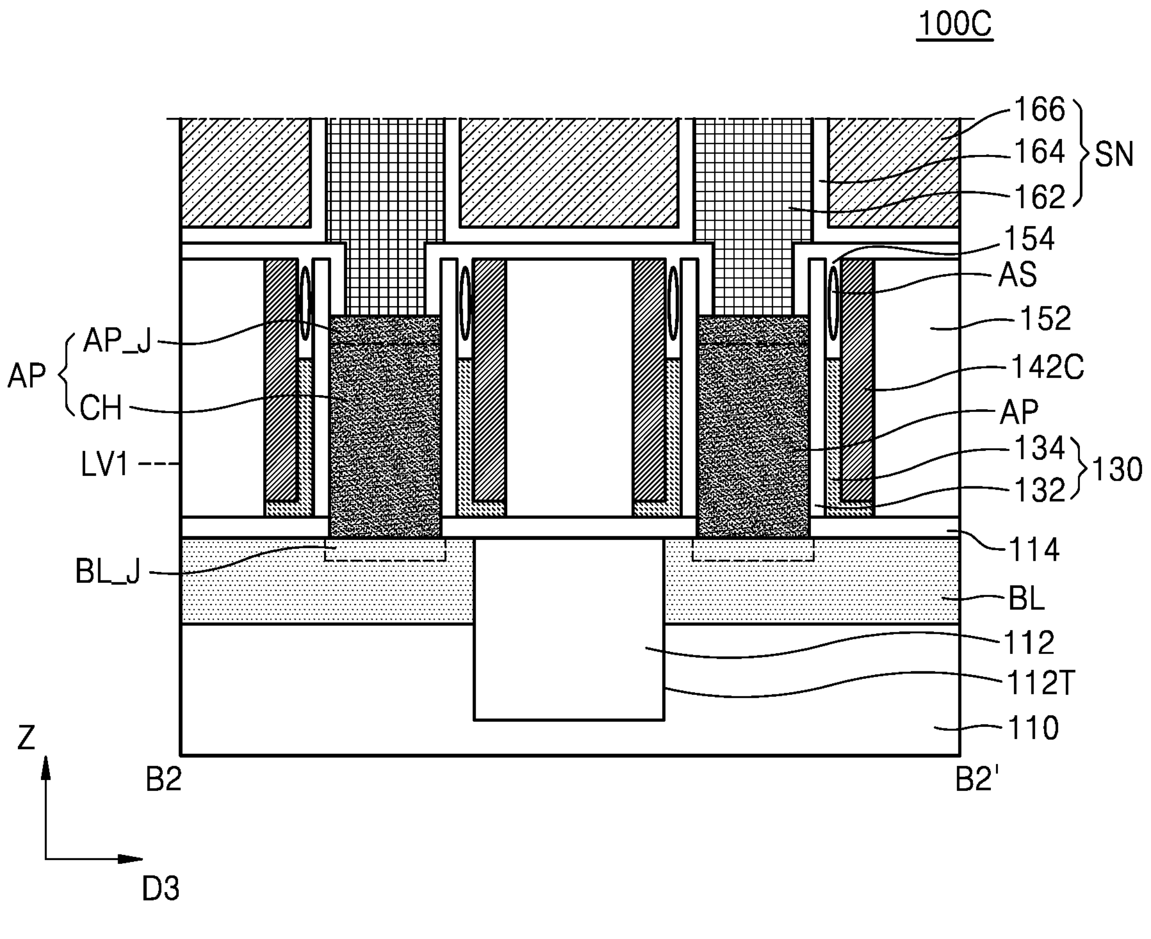
Figure 12:
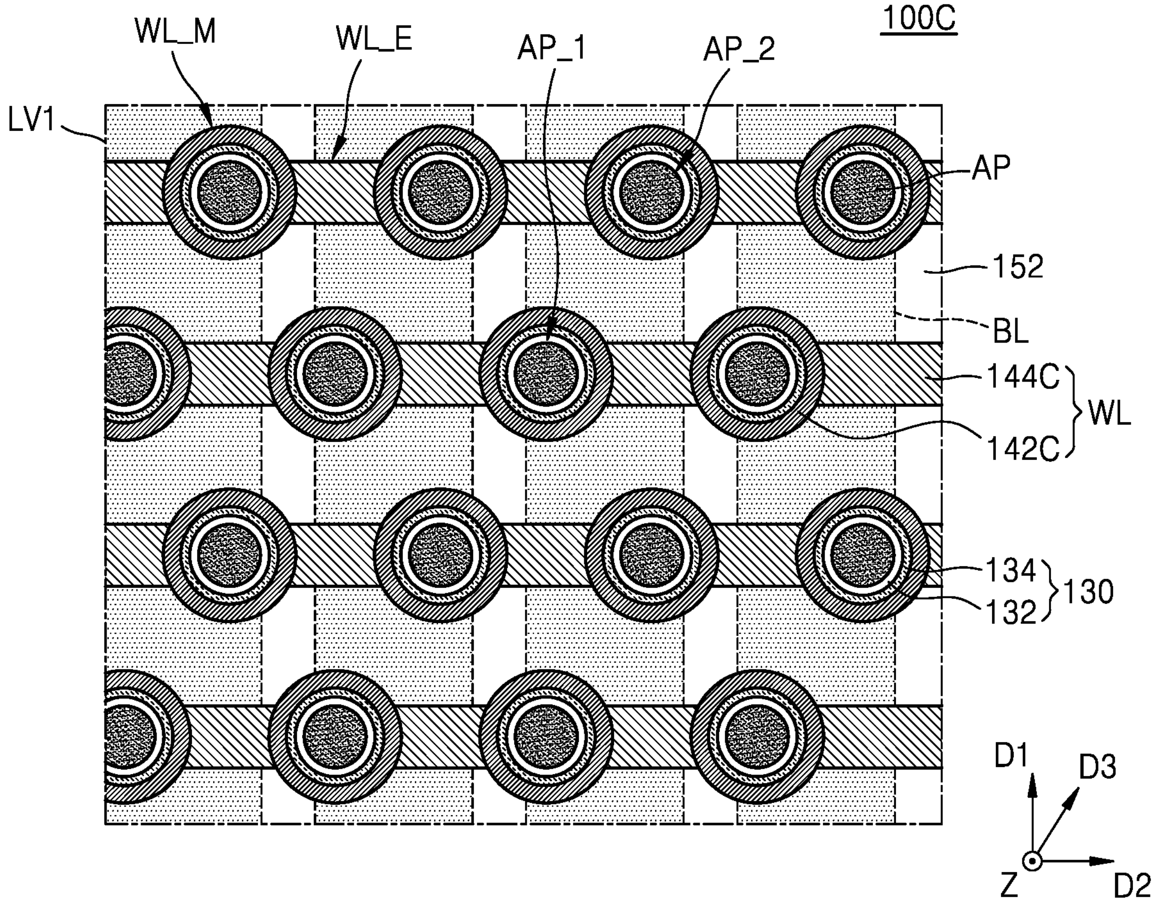
FIG. 12 is a horizontal cross-sectional view at a first vertical level of FIG. 10.

FIGS. 10 and 11 are cross-sectional views illustrating a semiconductor device 100C according to embodiments, and FIG. 12 is a horizontal cross-sectional view at a first vertical level LV1 in FIG. 10. FIG. 10 corresponds to a cross-section taken along line B1-B1' in FIG. 2, and FIG. 11 corresponds to a cross-section taken along line B2-B2' in FIG. 2. In FIGS. 10 to 12, the same reference symbols as those of FIGS. 1 to 9 denote the same elements.

Referring to FIGS. 10 to 12, the word line WL may include a work function adjustment layer 142C and a gate electrode layer 144C, and the work function adjustment layer 142C may have a relatively large width. The main gate portion WL_M of the word line WL may be formed to include only the work function adjustment layer 142C, and the connection gate portion WL_E of the word line WL may have a stack structure of the work function adjustment layer 142C and the gate electrode layer 144C. Accordingly, the work function adjustment layer 142C included in the main gate portion WL_M may be surrounded by the inter-gate insulating layer 152.

In embodiments, the work function adjustment layer 142C may include a plurality of material layers, and each of the plurality of material layers may include Ti, Ta, TiN, TaN, WN, TiC, TaC, TiAl, TaAl, TiAlC, TaAlC, TiAlN, TaAlN, HfAl, HfAlC, WSi, TiSi, HfSi, or a combination thereof. In other embodiments, the work function adjustment layer 142C may be formed of a single continuous material layer including one of Ti, Ta, TiN, TaN, WN, TiC, TaC, TiAl, TaAl, TiAlC, TaAlC, TiAlN, TaAlN, HfAl, HfAlC, WSi, TiSi, and HfSi.

Figure 13:
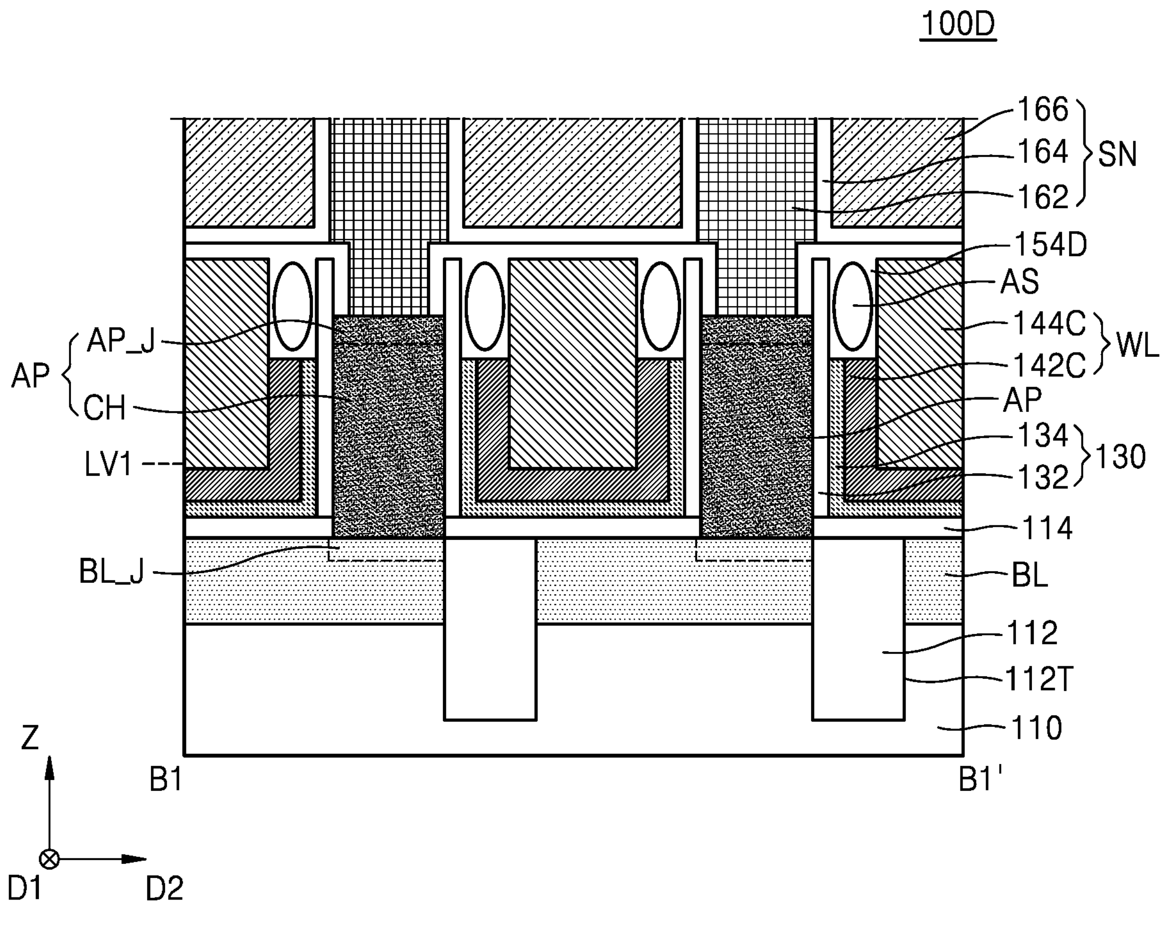
FIGS. 13 and 14 are cross-sectional views illustrating a semiconductor device according to embodiments.
Figure 14:
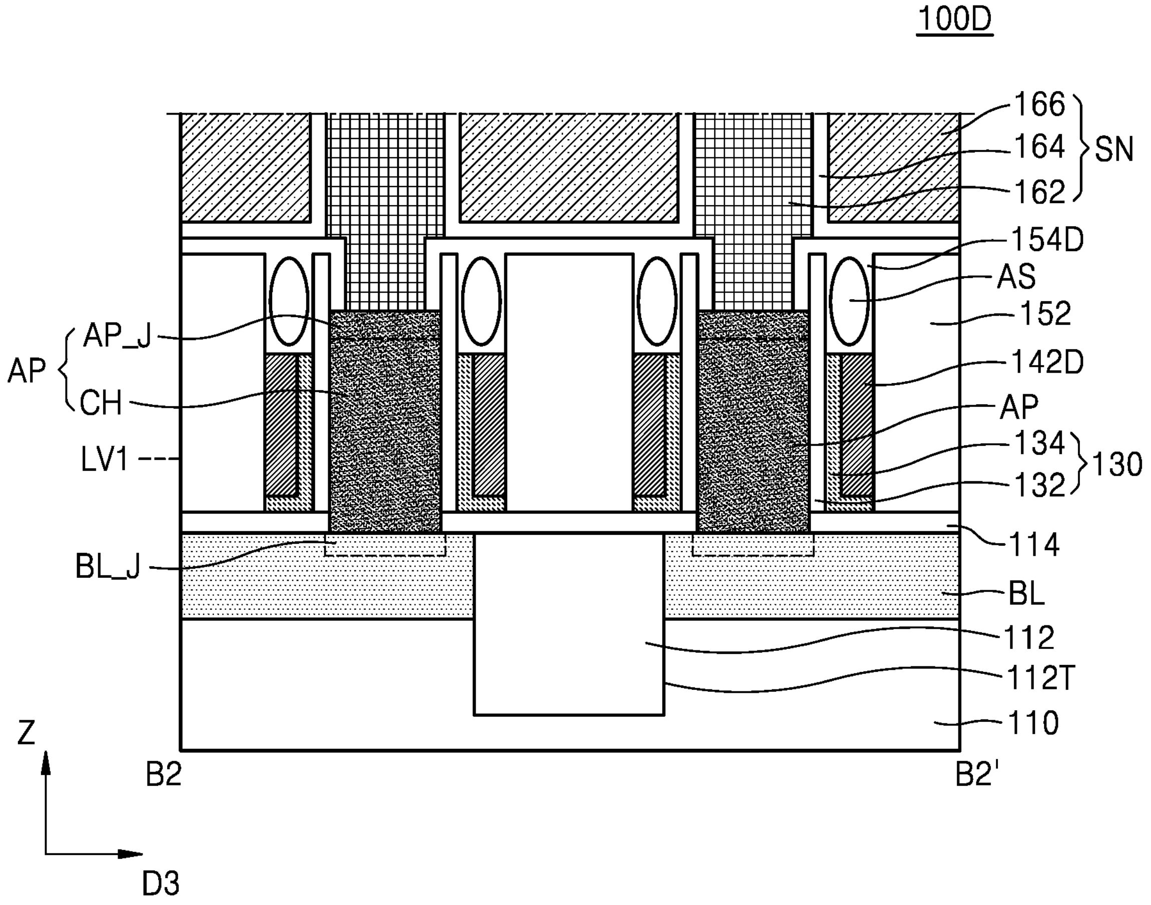

FIGS. 13 and 14 are cross-sectional views illustrating a semiconductor device 100D according to embodiments. In FIGS. 13 and 14, the same reference symbols as those of FIGS. 1 to 12 denote the same elements.

Referring to FIGS. 13 and 14, a work function adjustment layer 142D may have an upper surface at a lower vertical level than an upper surface of the gate electrode layer 144D. In addition, the work function adjustment layer 142D may have a relatively large width such that the main gate portion WL_M of the word line WL may be formed to include only the work function adjustment layer 142D, and the connection gate portion WL_E of the word line WL may have a stack structure of the work function adjustment layer 142D and the gate electrode layer 144D. Accordingly, the work function adjustment layer 142D included in the main gate portion WL_M may be surrounded by the inter-gate insulating layer 152.

The insulating liner 154D may be disposed on an inner wall of a space formed by the inner wall of the inter-gate insulating layer 152, an upper surface of the work function adjustment layer 142D, the upper surface of the second dielectric layer 134, and the outer wall of the first dielectric layer 132, and the air space AS may be arranged inside the insulating liner 154D. For example, the air space AS may be arranged at a location vertically overlapping the work function adjustment layer 142D and the second dielectric layer 134. The air space AS may be formed in a space provided by removing upper portions of the work function adjustment layer 142D and/or the second dielectric layer 134 by a pull-back process, and may have a relatively large volume.

Accordingly, the upper surface of the main gate portion WL_M may be at a lower vertical level than the upper surface of each of the plurality of semiconductor patterns AP, and accordingly, the sidewall of the bottom portion of the lower electrode 162 (for example, a portion of the bottom portion of the lower electrode 162 which is in contact with the insulating liner 154D) may not be surrounded by the main gate portion WL_M, but may be surrounded by the insulating liner 154D and the air space AS included in the insulating liner 154D. Accordingly, a relatively large separation distance between the lower electrode 162 and the word line WL may be ensured. For example, the bottom portion of the lower electrode 162 may be spaced apart in the vertical distance (Z) from the upper side of the main gate portion WL_M, and may have a relatively large separation distance in the second horizontal distance D2 from the upper side of the connection gate portion WL_E.

According to embodiments, because the sidewall of the bottom portion of the lower electrode 162 is surrounded by the air space AS and a relatively large separation distance between the lower electrode 162 and the word line WL is ensured, electric coupling caused by a relatively high voltage applied to the lower electrode 162 may be prevented.

FIGS. 15A to 25 are diagrams illustrating a method of manufacturing a semiconductor device 100, according to embodiments, according to a process order. Specifically, FIGS. 15A, 16A, 17A, 19A, and 20A are top views corresponding to region A in FIG. 1, FIGS. 15B, 16B, 17B, 18, 19B, 20B, 23, 24, and 25 correspond to cross-sections taken along line B1-B1', and FIGS. 19C, 29C, 21, and 22 correspond to cross-sections taken along line B2-B2' in FIG. 19A. In FIGS. 15A to 25, the same reference symbols as those of FIGS. 1 to 14 denote the same elements.

Figure 15A:
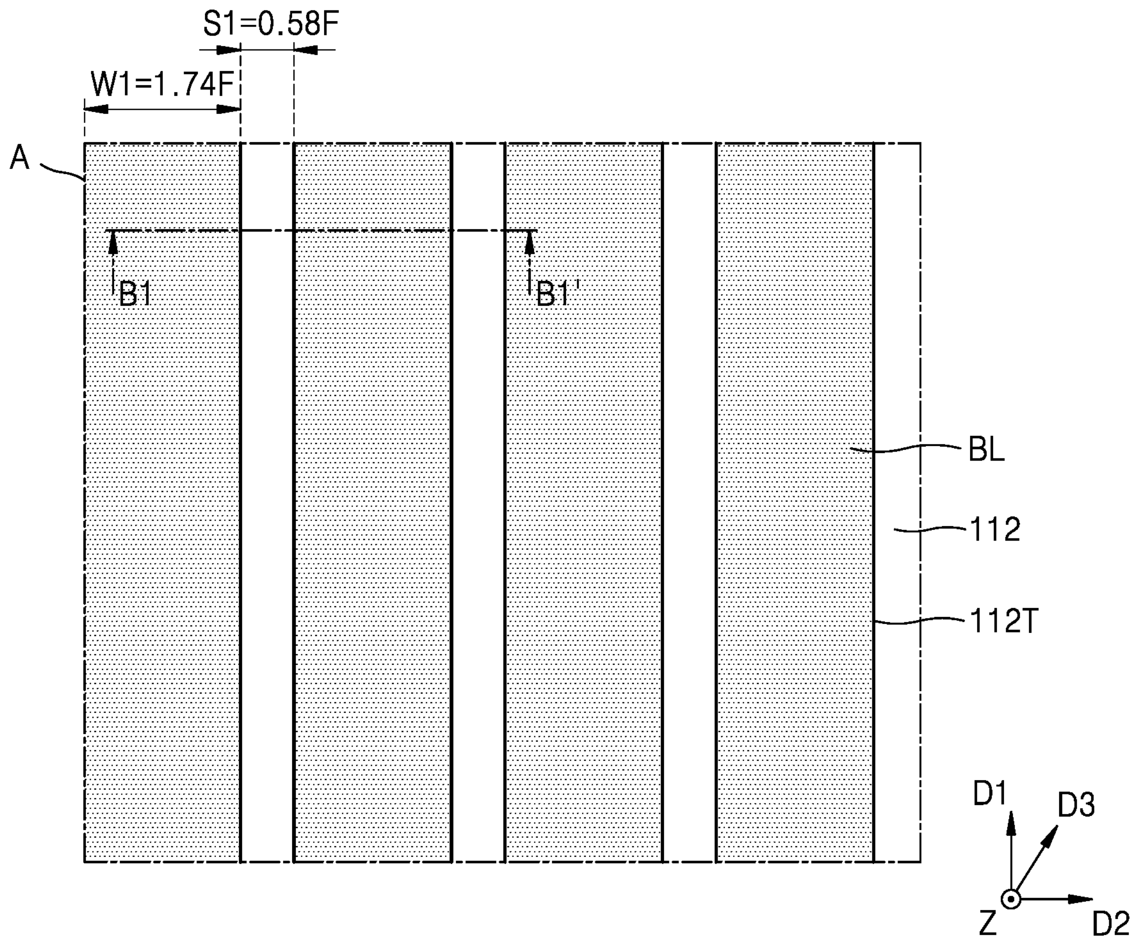
Figure 15B:
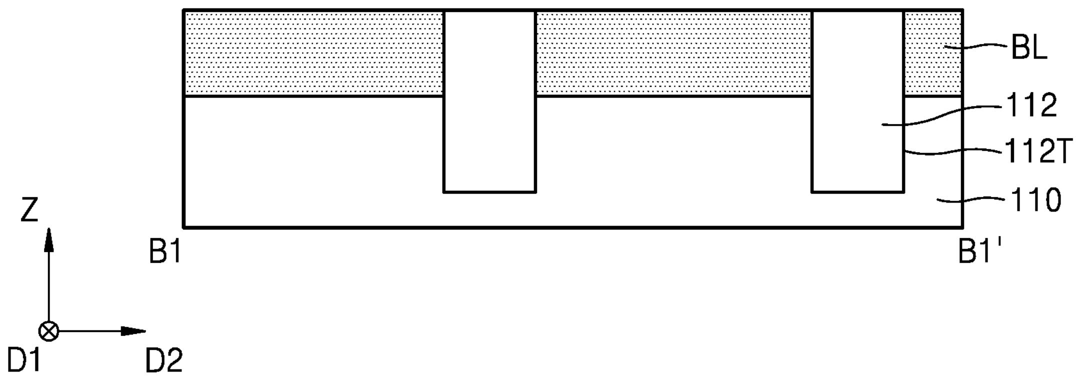

Referring to FIGS. 15A and 15B, a mask pattern (not shown) is formed on the substrate 110, and an element isolation trench 112T may be formed on the substrate 110 by removing a portion of the substrate 110. Thereafter, an insulating layer (not shown) is formed in the element isolation trench 112T, and the element isolation layer 112 may be formed by performing a planarization process on an upper portion of the insulating layer.

Thereafter, the plurality of bit lines BL may be formed by implanting n-type impurities into the substrate 110 from the upper surface of the substrate 110 to a certain depth through an ion implantation process. In embodiments, the plurality of bit lines BL may each extend in the first horizontal direction D1, and may be arranged with a first width W1 and a first distance S1 in the second horizontal direction D2. For example, when F corresponds to a unit feature size, the first width W1 may correspond to about 1.74F, and the first distance S1 may correspond to about 0.58F.

In some other embodiments, a conductive layer (not shown) is formed on the upper surface of the substrate 110, and the plurality of bit lines BL may be formed by patterning the conductive layer.

Figure 16A:
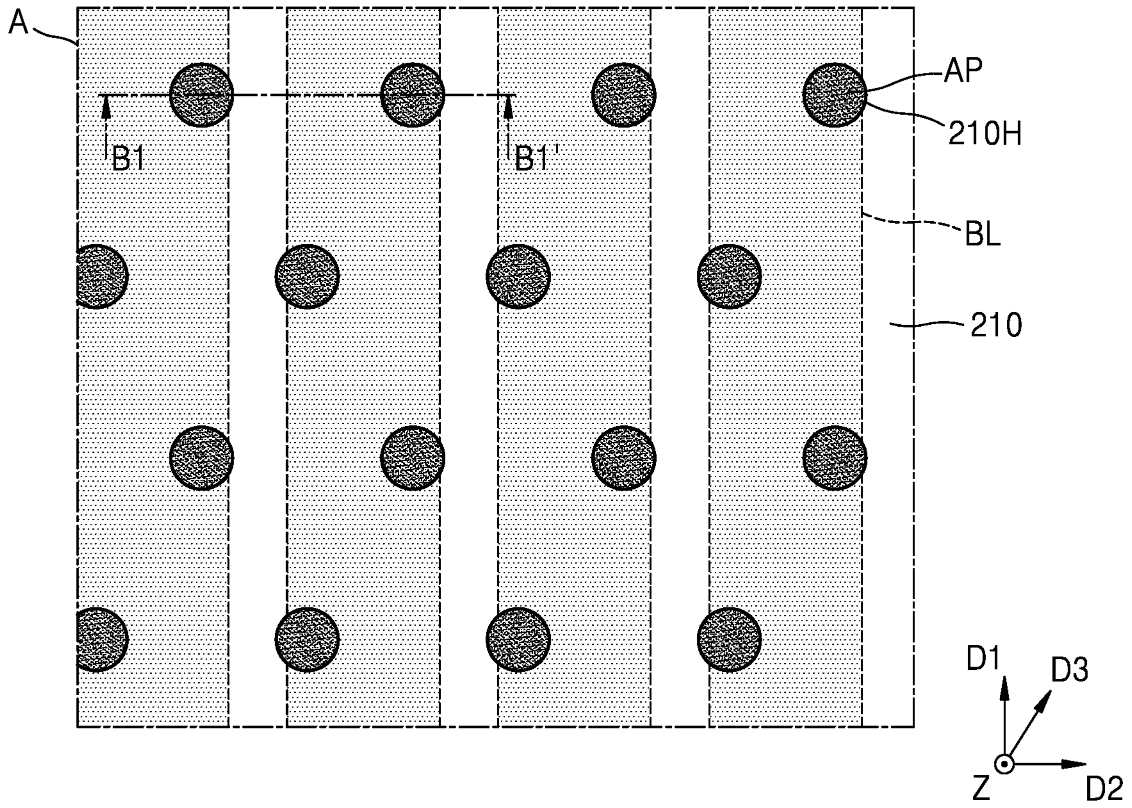
Figure 16B:
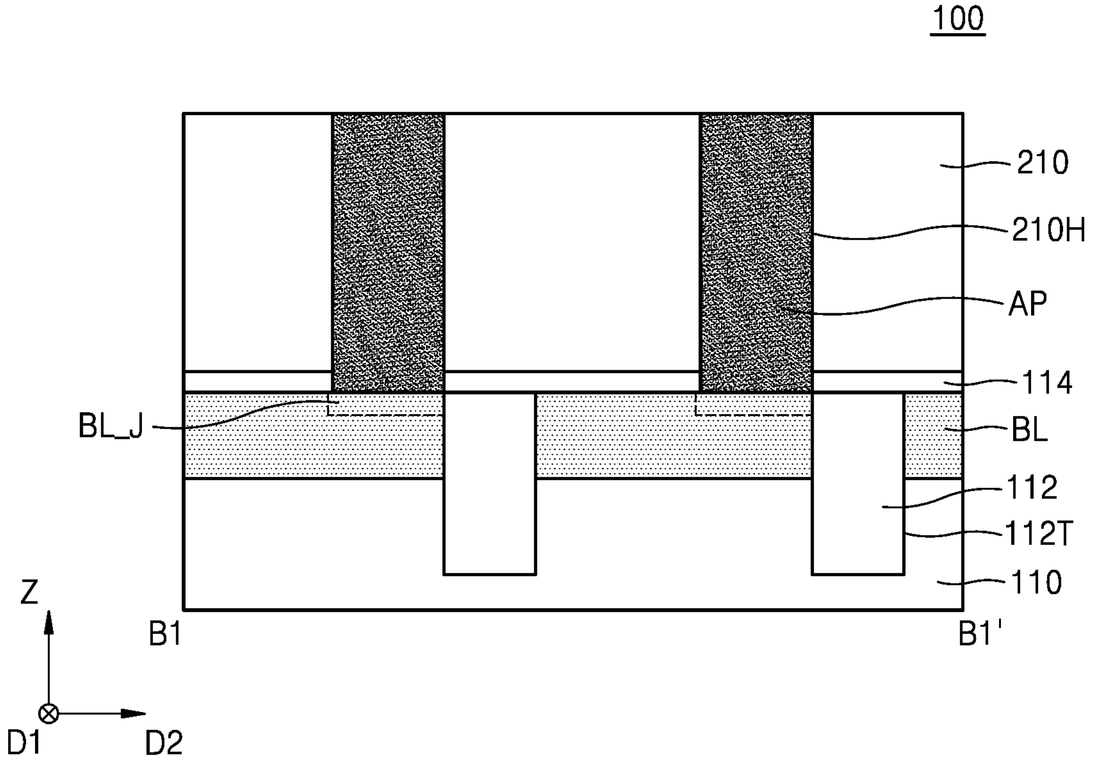

Referring to FIGS. 16A and 16B, the buffer insulating layer 114 may be formed on the upper surfaces of the bit line BL and the element isolation layer 112, and a first mold layer 210 may be formed on the buffer insulating layer 114.

Thereafter, a mask pattern (not shown) may be formed on the first mold layer 210, and a plurality of openings 210H may be formed in the first mold layer 210 by using the mask pattern. The plurality of openings 210H may be arranged in a hexagonal array.

Thereafter, the upper surface of the bit line BL may be exposed by removing portions of the buffer insulating layer 114 exposed through bottom portions of the plurality of openings 210H. The junction area BL_J may be formed on the upper side of the bit line BL by implanting impurities through an ion implantation process.

Thereafter, the plurality of semiconductor patterns AP may be formed in the plurality of openings 210H. In embodiments, the plurality of semiconductor patterns AP may be formed by an epitaxy growth process using the upper surface of the bit line BL exposed through the bottom portions of the plurality of openings 210H as a seed layer. In other embodiments, the plurality of semiconductor patterns AP filling the plurality of openings 210H may be formed by a chemical vapor deposition (CVD) process, an atomic layer deposition (ALD) process, or the like.

Figure 17A:
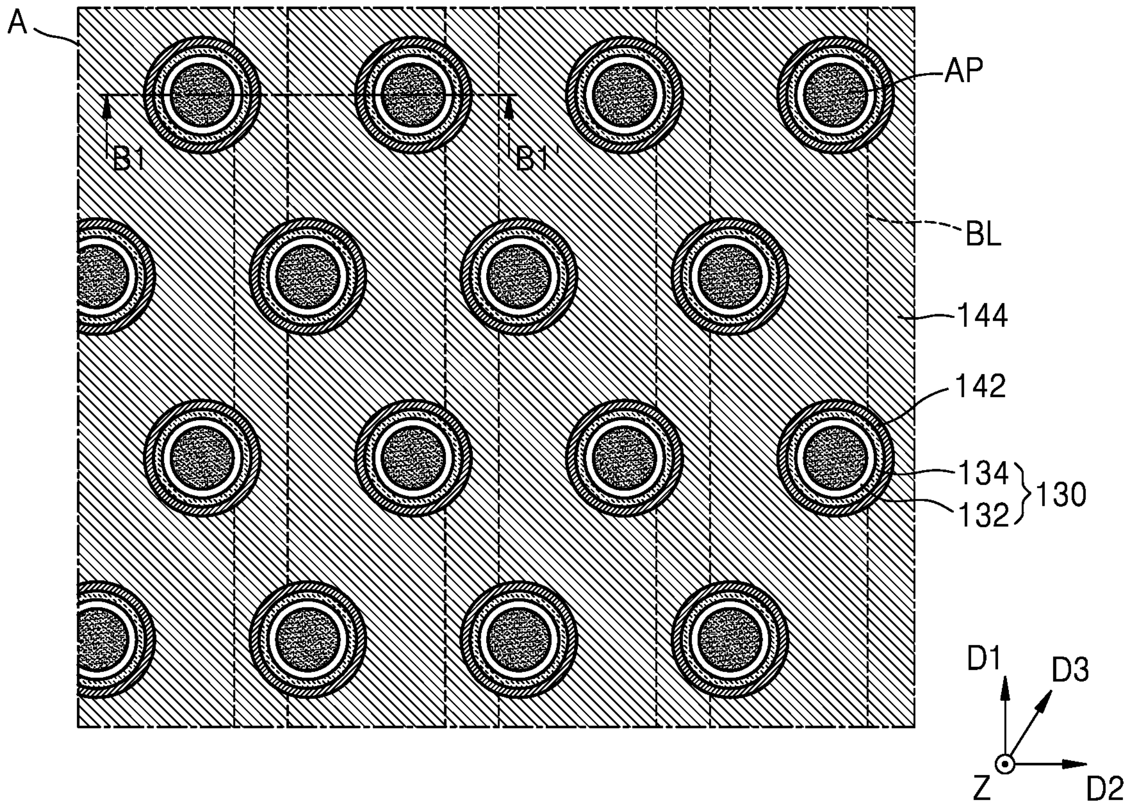
Figure 17B:
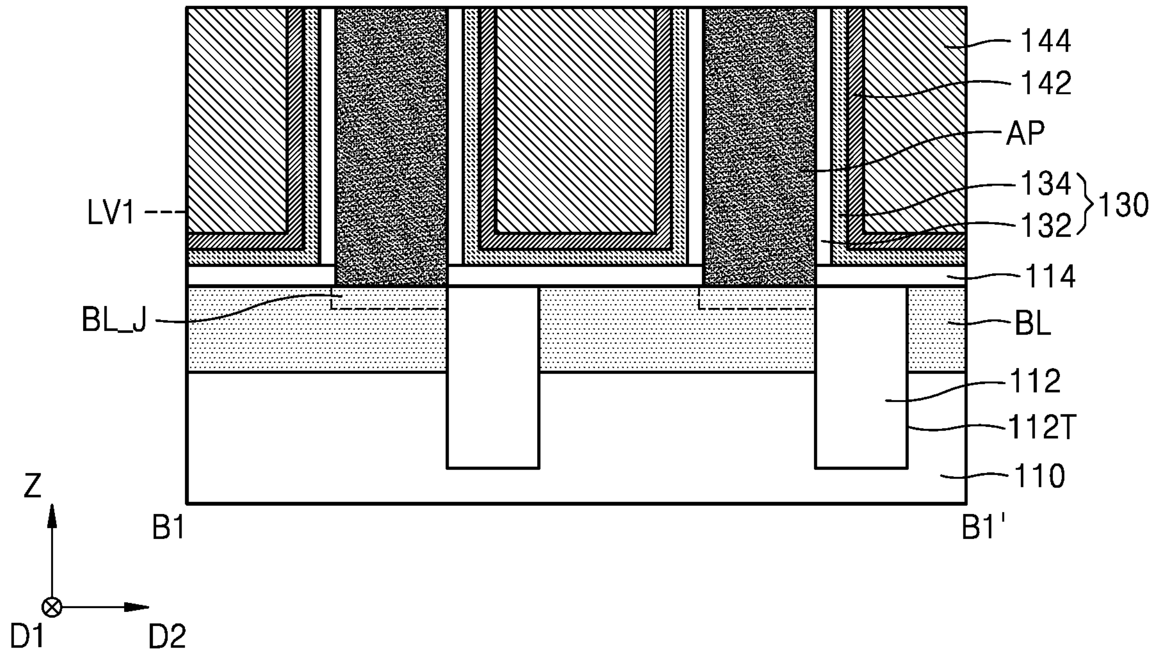

Referring to FIGS. 17A and 17B, the first mold layer 210 may be removed, and the first dielectric layer 132, the second dielectric layer 134, the work function adjustment layer 142, and the gate electrode layer 144 may be sequentially formed on the sidewalls of the plurality of semiconductor patterns AP, and the upper surfaces of the plurality of semiconductor patterns AP may be exposed by planarizing an upper surface of the structure.

In embodiments, the first dielectric layer 132 may be formed by thermal oxidation process, a CVD process, an ALD process, or the like. The second dielectric layer 134 may be formed by a CVD process, an ALD process, or the like using a high-k dielectric material. A stack structure of the first dielectric layer 132 and the second dielectric layer 134 may be referred to as the gate insulating layer structure 130.

As a result of the planarization process described above, the upper surface of the gate insulating layer structure 130 may be disposed at the same vertical level as the upper surfaces of the plurality of semiconductor patterns AP and the upper surface of the gate electrode layer 144.

Figure 18:
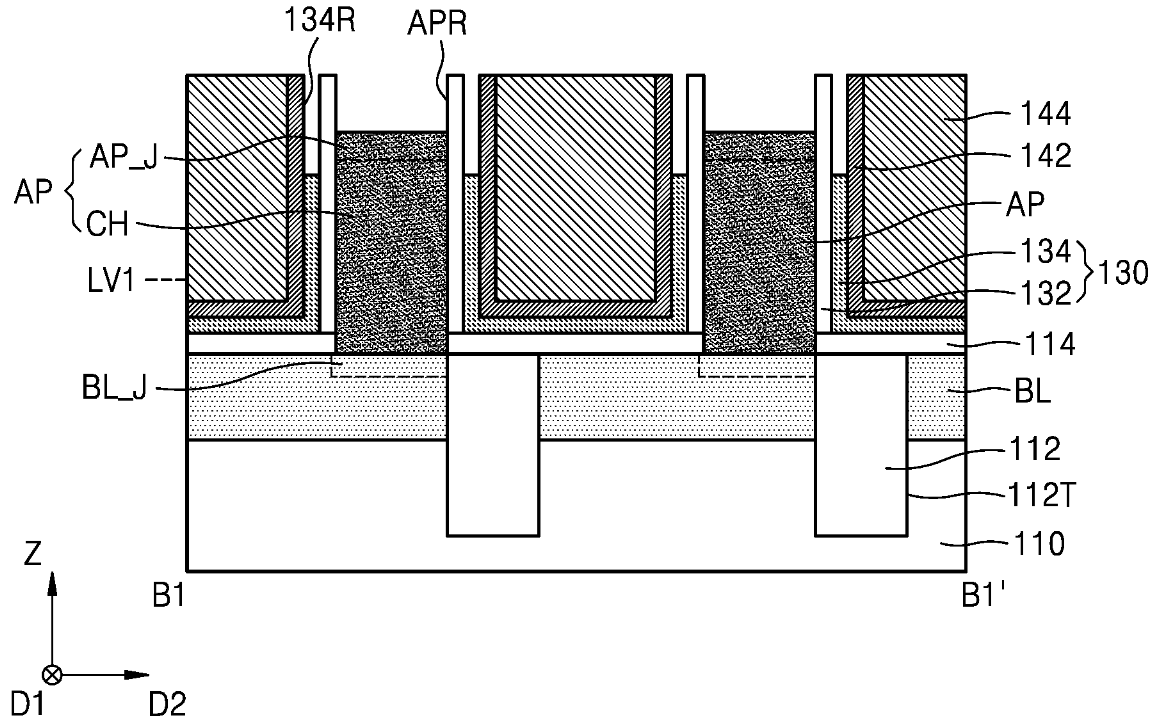

Referring to FIG. 18, a first recess space APR may be formed by performing a pull-back process for removing an upper portion of the plurality of semiconductor patterns AP. In embodiments, the pull-back process may be a wet-etching process using ammonium hydroxide ($NH_4OH$) as an etchant, but is not limited thereto. As a result of the pull-back process described above, the upper surfaces of the plurality of semiconductor patterns AP may be disposed at a lower vertical level than the upper surface of the gate insulating layer structure 130 and the upper surface of the gate electrode layer 144. In addition, a portion of an inner wall of the gate insulating layer structure 130 within the first recess space APR (for example, an inner wall of the first dielectric layer 132) may be exposed.

Thereafter, the junction area AP_J may be formed by implanting impurities to the upper sides of the plurality of semiconductor patterns AP through an ion implantation process.

Thereafter, a second recess space 134R may be formed by performing a pull-back process for removing an upper portion of the second dielectric layer 134. As a result of the pull-back process described above, the upper portion of the second dielectric layer 134 may be disposed at a lower vertical level than the upper surface of the first dielectric layer 132, the upper surface of the plurality of semiconductor patterns AP, and the upper surface of the gate electrode layer 144. In addition, a portion of an outer wall of the first dielectric layer 132 and a portion of an inner wall of the work function adjustment layer 142 may be exposed in the second recess space 134R.

Figure 19A:
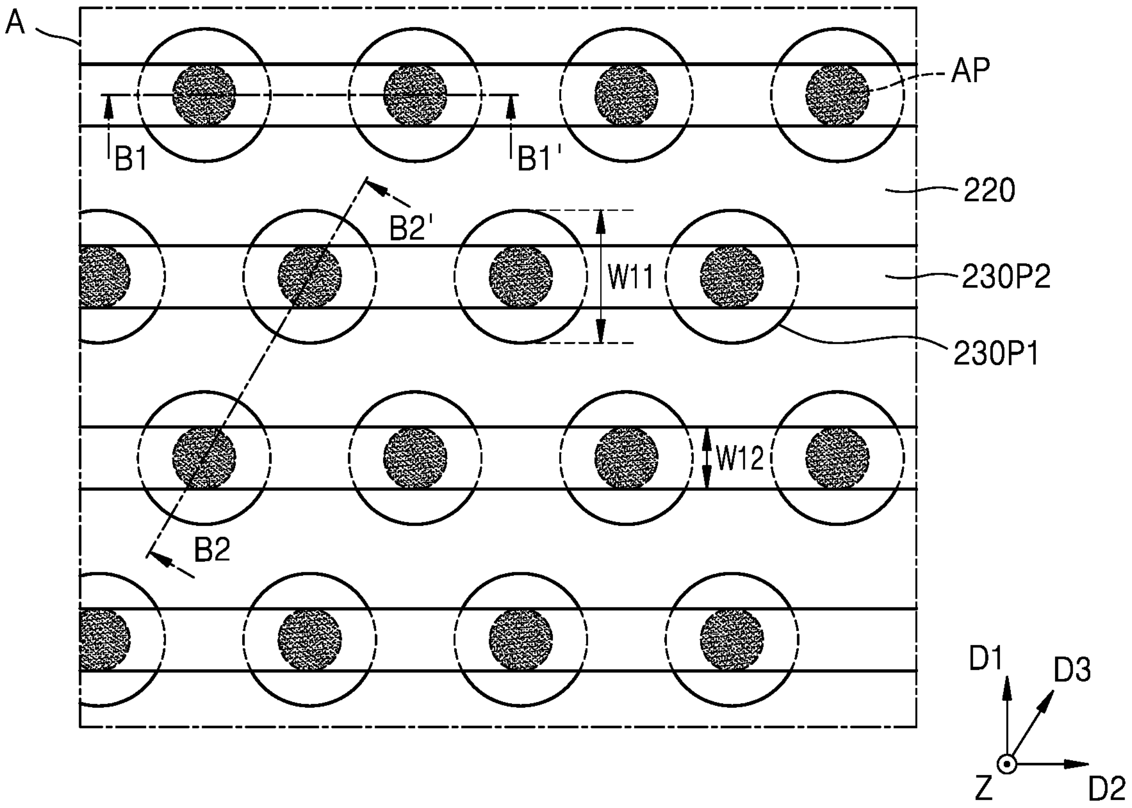
Figure 19B:
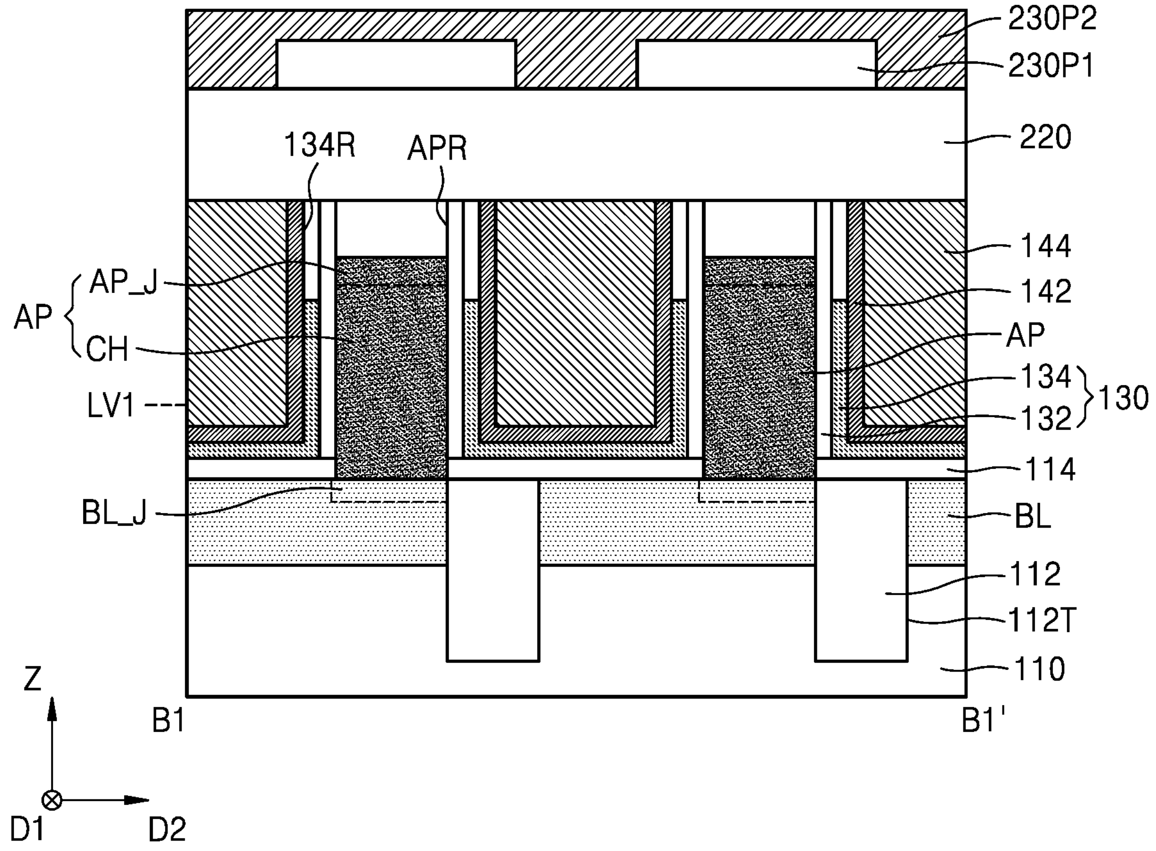
Figure 19C:
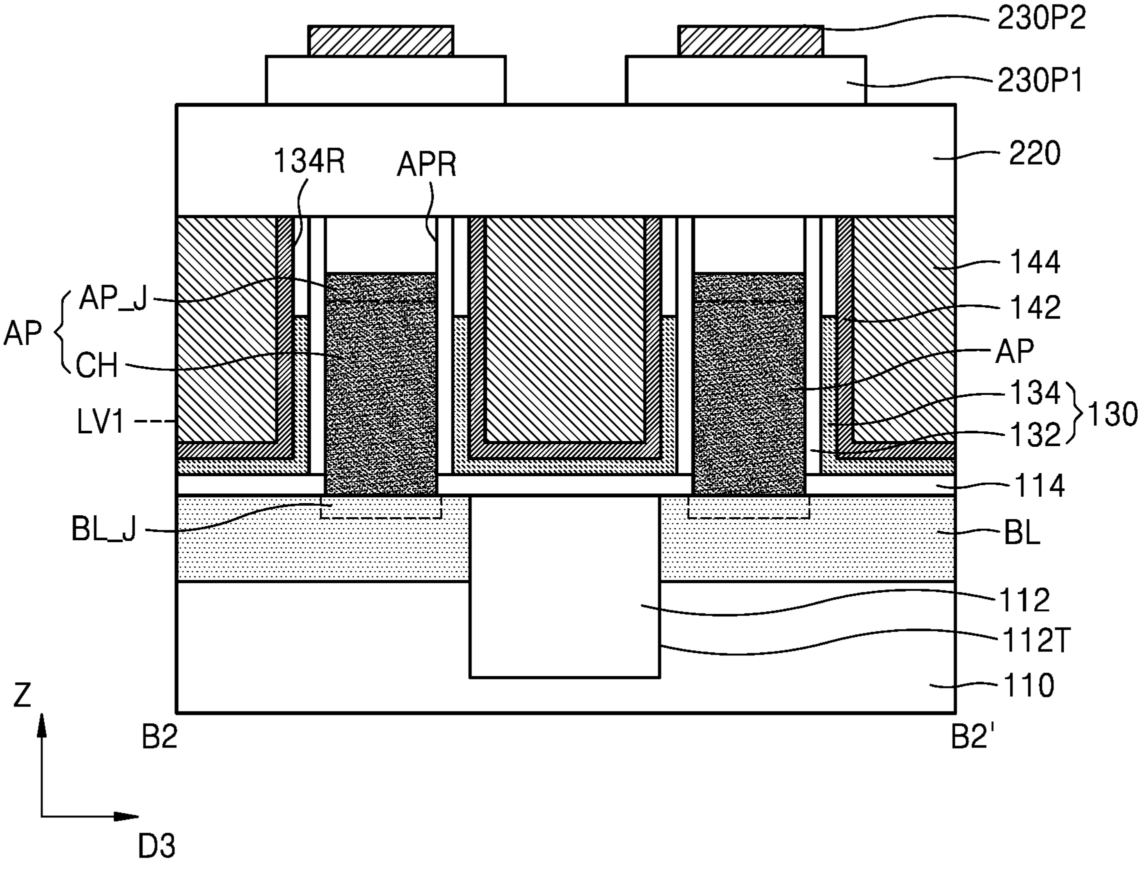

Referring to FIGS. 19A to 19C, a transfer mask layer 220 may be formed on the gate electrode layer 144, and a first mask pattern 230P1 and a second mask pattern 230P2 may be sequentially formed on the transfer mask layer 220.

In embodiments, the first mask pattern 230P1 may include an island-type pattern arranged in a hexagonal array, and the second mask pattern 230P2 may include a line-type pattern extending in the second horizontal direction D2.

In embodiments, a first mask material layer (not shown) may be formed on the transfer mask layer 220, and the first mask pattern 230P1 having a hexagonal array may be formed by patterning the first mask material layer. Thereafter, a second mask material layer (not shown) covering the first mask pattern 230P1 may be formed on the transfer mask layer 220, and the second mask pattern 230P2 having a line pattern shape may be formed by patterning the second mask material layer. The second mask material layer may include a material having an etch selectivity with respect to the first mask material layer, and accordingly, the first mask pattern 230P1 may remain without being removed in a process of forming the second mask pattern 230P2.

The first mask pattern 230P1 may have a circular planar shape having a first width W11 which is relatively large, and may be arranged in a hexagonal array. The second mask pattern 213P2 may have a line shape having a second width W22 which is relatively small. As shown in the top view of FIG. 19A, an upper portion of the first mask pattern 230P1 may be exposed by not being covered by the second mask pattern 230P2.

Figure 20A:
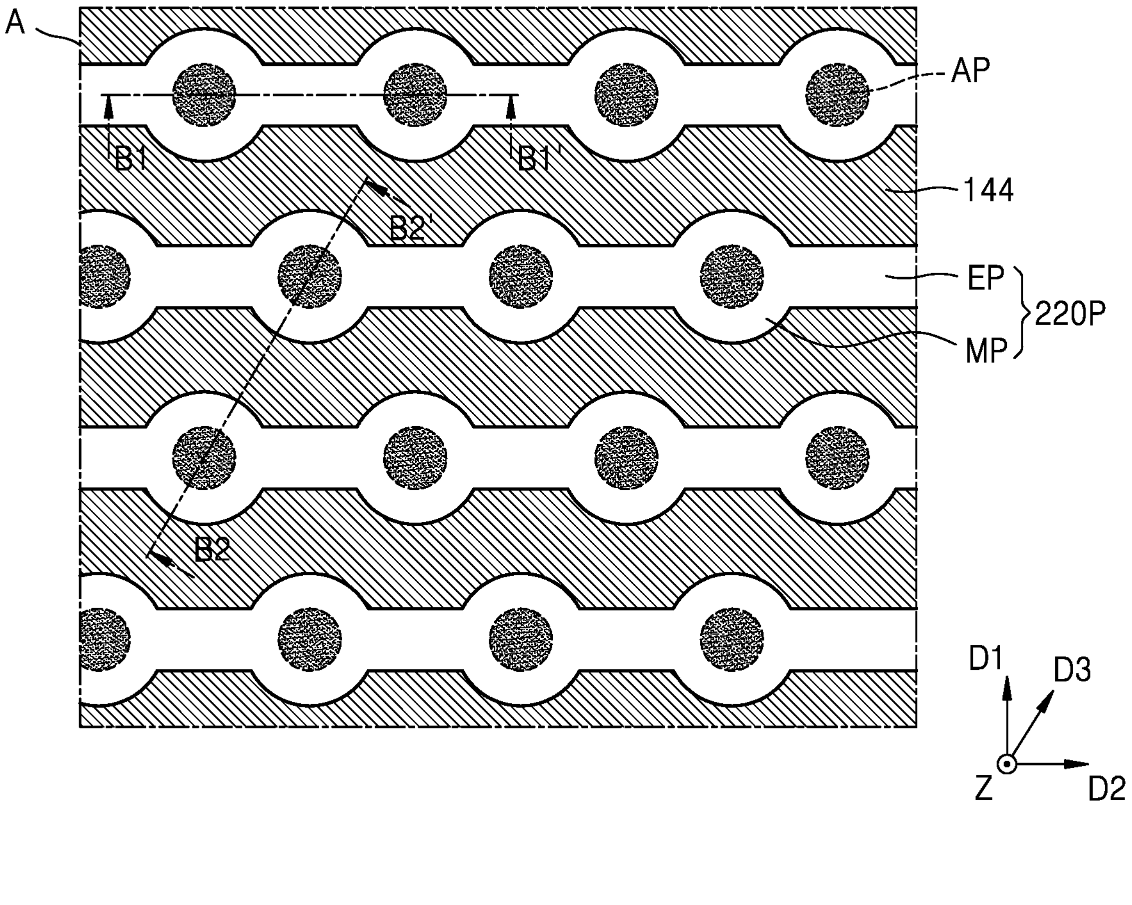
Figure 20B:
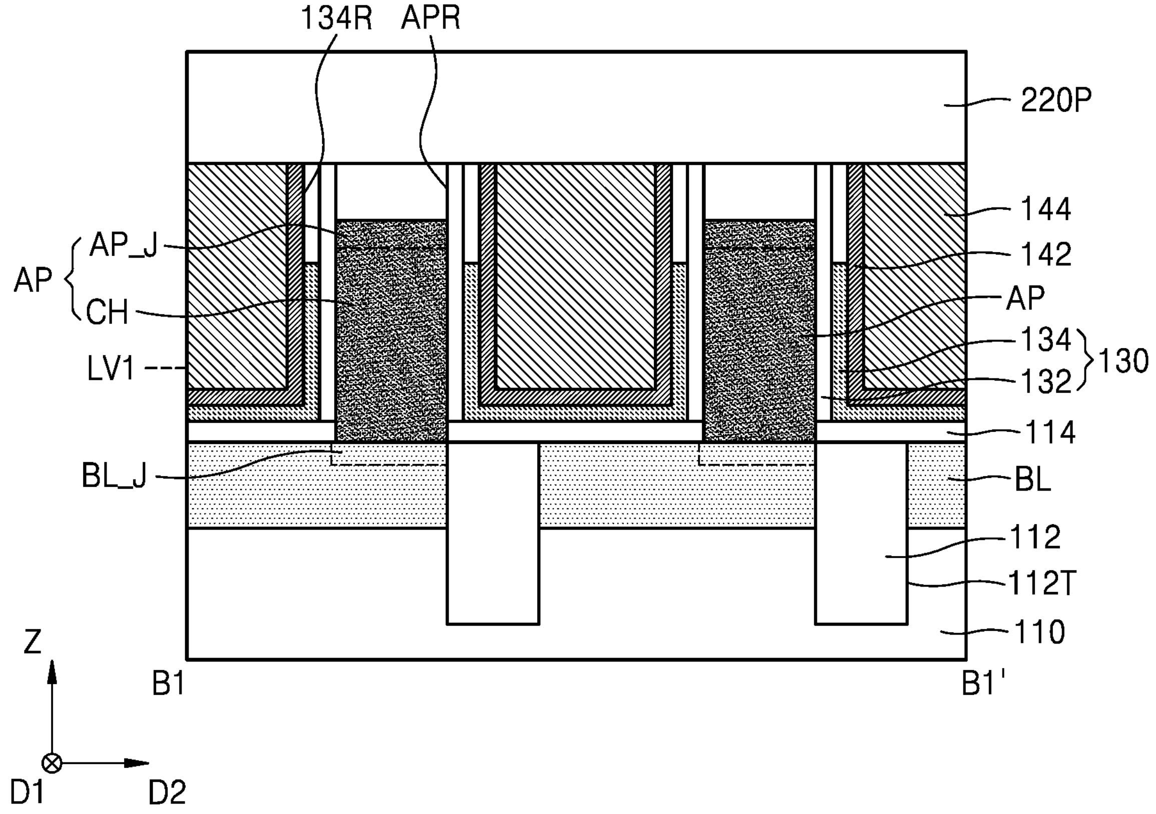
Figure 20C:
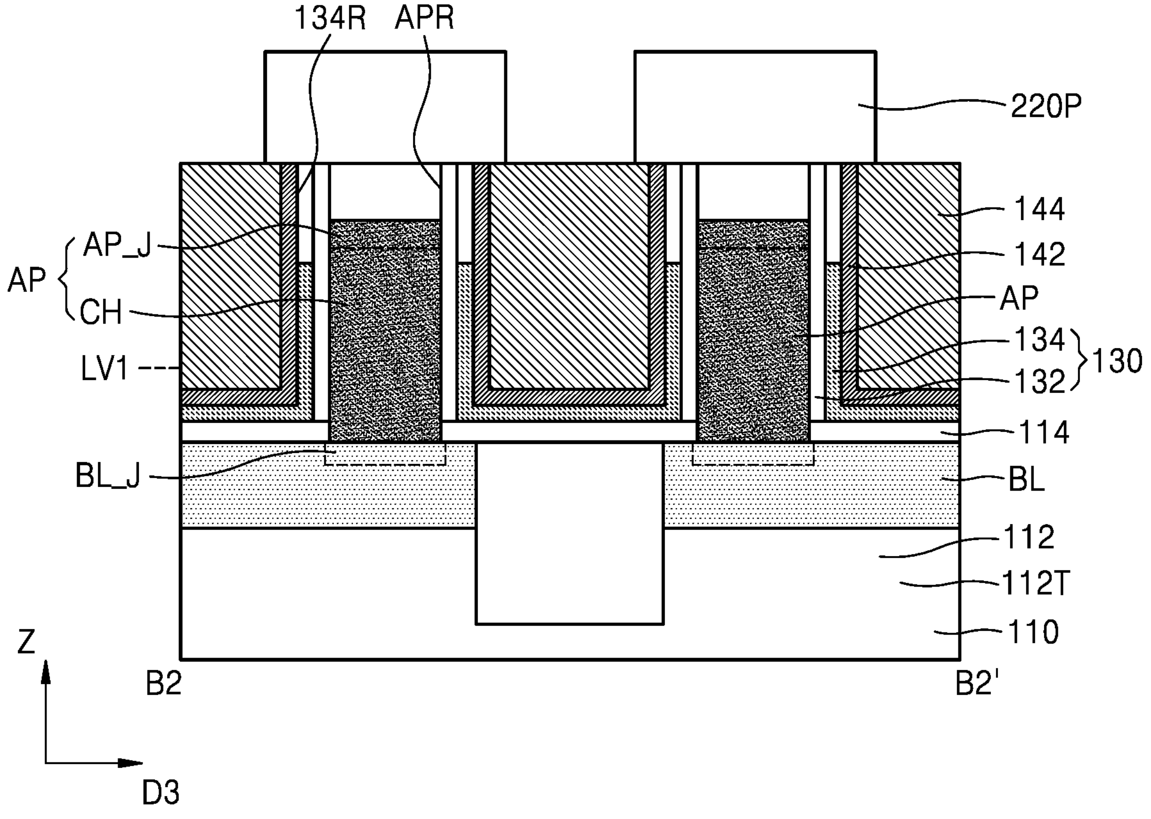

Referring to FIGS. 20A to 20C, a transfer mask pattern 220P may be formed by patterning the transfer mask layer 220 using the first mask pattern 230P1 and the second mask pattern 230P2 as etch masks. The transfer mask pattern 220P may include a main pattern portion MP corresponding to the first mask pattern 230P1, and a connection pattern portion EP corresponding to the second mask pattern 230P2.

The main pattern portion MP may have a circular planar shape having a relatively large width, and may be arranged in a hexagonal array. The connection pattern portion EP may have a line shape having a relatively small width.

Figure 21:
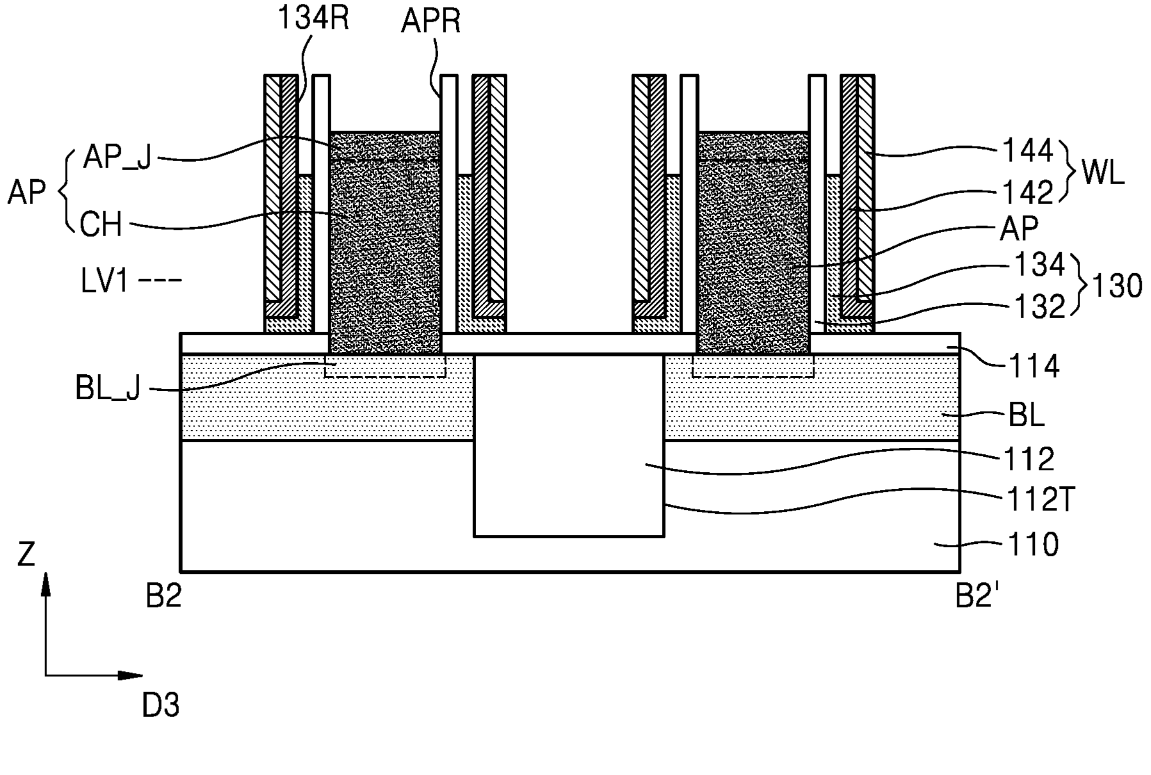

Referring to FIG. 21, portions of the gate electrode layer 144, work function adjustment layer 142, and the first dielectric layer 132 may be removed by using the transfer mask pattern 220P as an etch mask, and the plurality of word lines WL each extending in the second horizontal direction D2 may be formed. The plurality of word lines WL may include the main gate portion WL_M (see FIG. 5) of a shape corresponding to the main pattern portion MP of the transfer mask pattern 220P, and the connection gate portion WL_E (see FIG. 5) of a shape corresponding to the connection pattern portion EP of the transfer mask pattern 220P.

Figure 22:
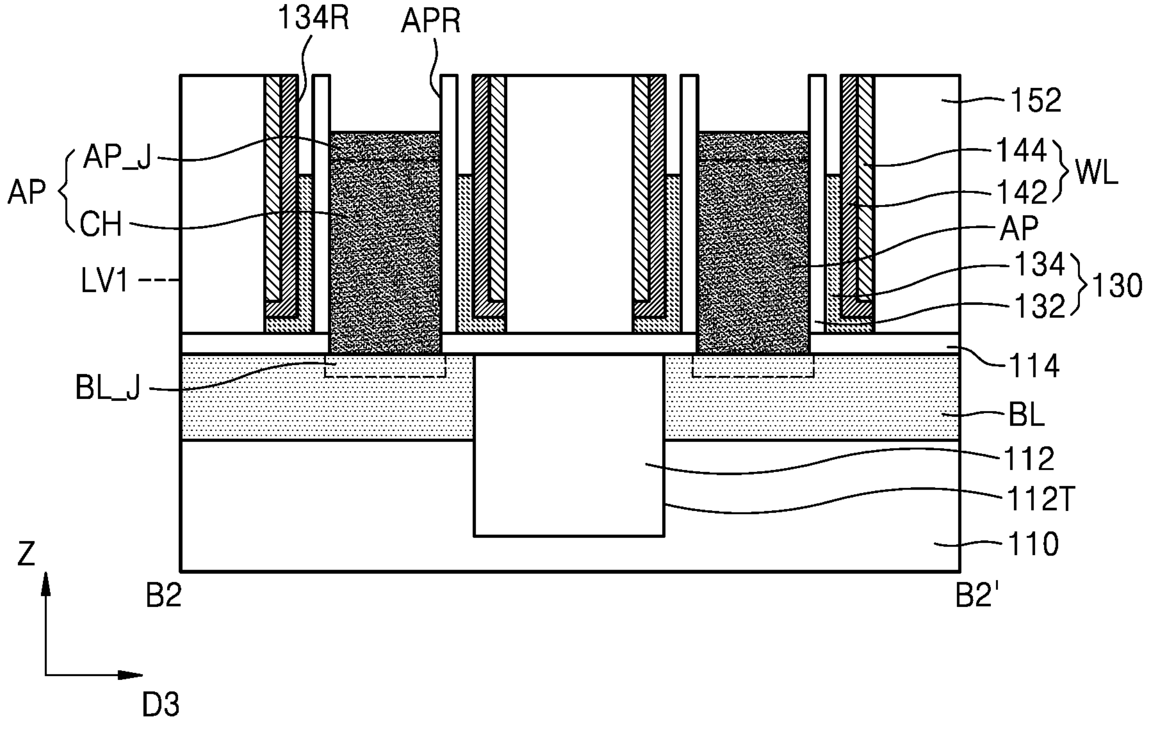

Referring to FIG. 22, the inter-gate insulating layer 152 filling a space between the plurality of word lines WL may be formed. In embodiments, the inter-gate insulating layer 152 may be formed by a spin coating process, a CVD process, an ALD process, or the like using a silicon oxide, silicon nitride, silicon oxynitride, or low-k (low dielectric constant) dielectric material.

Figure 23:
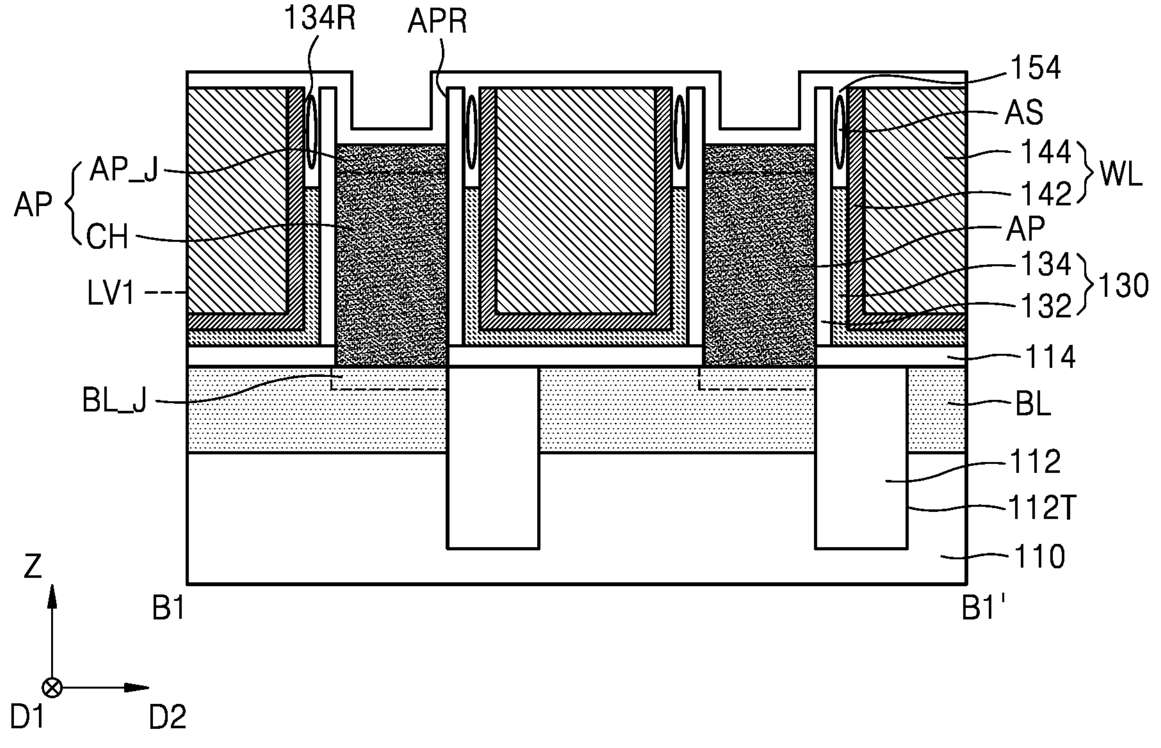

Referring to FIG. 23, the insulating liner 154 may be formed on the plurality of semiconductor patterns AP, the plurality of word lines WL, and the inter-gate insulating layer 152. The insulating liner 154 may be conformally formed on an inner wall of the first recess space APR.

In embodiments, the insulating liner (154) may be formed by using a silicon nitride or silicon oxynitride. In some embodiments, the insulating liner 154 may be formed by using a material having poor step coverage, and in a process of forming the insulating liner 154 in the second recess space 134R that is relatively narrow, when the inside of the second recess space 134R is not completely filled, the entrance of the second recess space 134R may be blocked and the air space AS may be formed inside the insulating liner 154.

Figure 24:
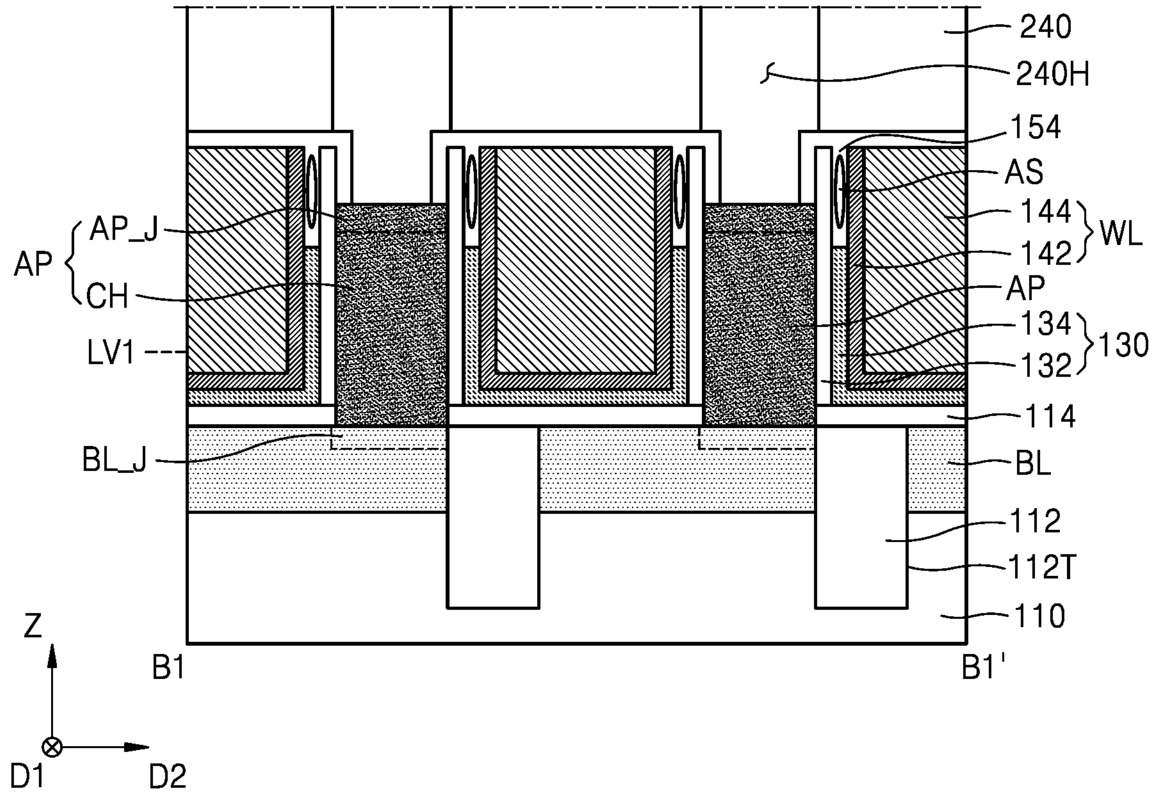

Referring to FIG. 24, a second mold layer 240 may be formed on the insulating liner 154, and a second opening 240H may be formed on the second mold layer 240 by using a mask pattern (not shown). The second opening 240H may be arranged in a hexagonal array, and may be arranged at a location vertically overlapping each of the plurality of semiconductor patterns AP.

In an etching process for forming the second opening 240H, the insulating liner 154 may function as an etch stop layer, and accordingly, a bottom portion of the second opening 240H may be formed in a self-aligned manner. For example, even when pattern misalignment or warpage of the substrate 110 occurs during a patterning process for forming the second opening 240H, the bottom portion of the second opening 240H may be arranged in the first recess portion APR surrounded by the insulating liner 154.

Figure 25:
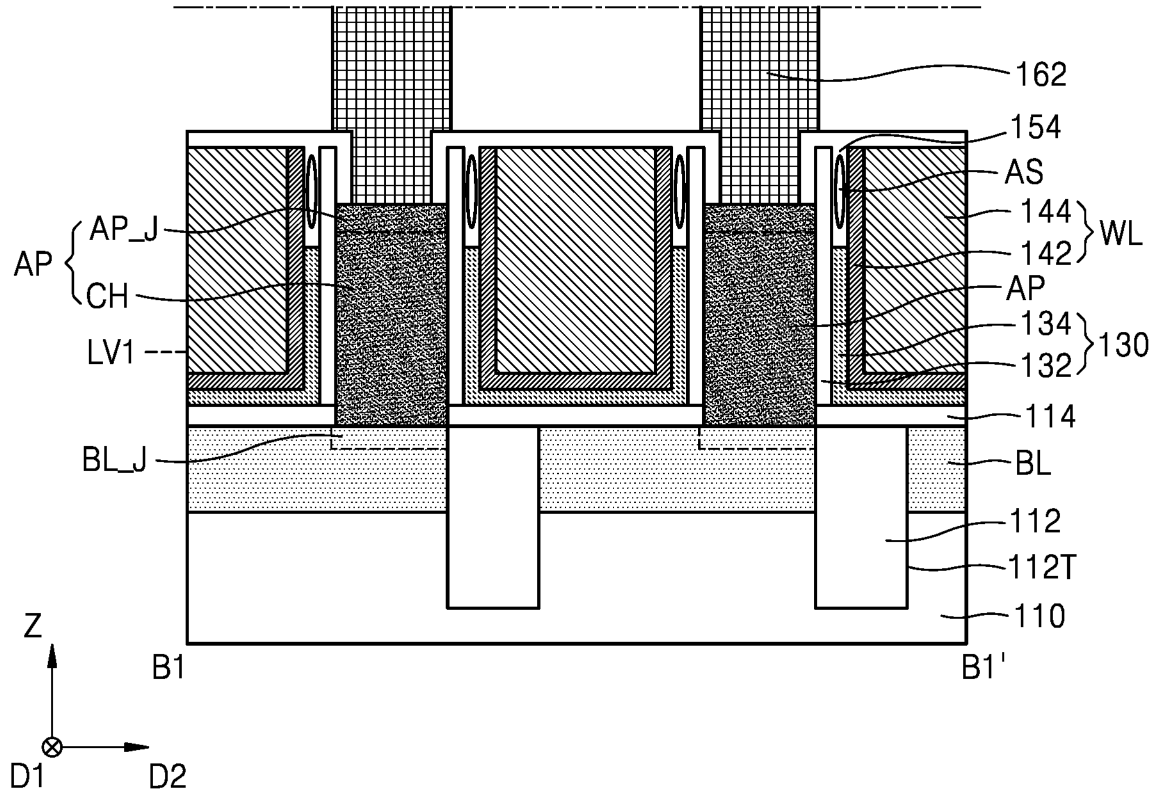

Referring to FIG. 25, the lower electrode 162 may be formed in the second mold layer 240. Thereafter, the second mold layer 240 may be removed.

In embodiments, the lower electrode 162 may be formed by using Ti, Ta, niobium, ruthenium TiN, TaN, niobium nitride, ruthenium nitride, tungsten, WN, doped polysilicon, or doped silicon-germanium.

Referring to FIG. 3 again, the capacitor dielectric layer 164 and the upper electrode 166 may be sequentially formed on the lower electrode 162.

In embodiments, the capacitor dielectric layer 164 may be formed by using a hafnium oxide, zirconium oxide, titanium oxide, aluminum oxide, lanthanum oxide, hafnium silicon oxide, zirconium silicon oxide, titanium silicon oxide, aluminum silicon oxide, hafnium zirconium oxide, zirconium aluminum oxide, hafnium lanthanum oxide, titanium zirconium aluminum oxide, or a combination thereof, and the upper electrode 166 may be formed by using Ti, Ta, niobium, ruthenium, TiN, TaN, niobium nitride, ruthenium nitride, tungsten, WN, doped polysilicon, doped silicon-germanium, or a combination thereof.

The semiconductor device 100 is completed by performing the process described above.

According to the embodiments described above, because the plurality of semiconductor patterns AP are arranged in a hexagonal array, the vertical channel transistor TR1 may have a reduced unit cell area of $4.64F^2$. In addition, because the word line WL has a GAA structure surrounding all sidewalls of the plurality of semiconductor patterns AP, GIDL may be significantly reduced or prevented. Furthermore, because the lower electrode 162 is in contact with the semiconductor pattern AP in a self-aligned manner and the air space AS is arranged between the lower electrode 162 and the word line WL, electric coupling caused by a relatively high voltage applied to the lower electrode 162 may be prevented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A semiconductor device comprising:

a plurality of bit lines each extending in a first direction on a substrate and spaced apart from each other in a second direction perpendicular to the first direction;

a plurality of semiconductor patterns respectively disposed on the plurality of bit lines, the plurality of semiconductor patterns comprising a first semiconductor pattern disposed on a first bit line from among the plurality of bit lines, and a second semiconductor pattern arranged to be offset in the second direction from the first semiconductor pattern on the first bit line;

a plurality of word lines each extending in the second direction and surrounding a sidewall of each of the plurality of semiconductor patterns, the plurality of word lines comprising a first word line extending in the second direction and surrounding the first semiconductor pattern, and a second word line spaced apart in the first direction from the first word line and extending in the second direction while surrounding the second semiconductor pattern; and a plurality of storage nodes respectively disposed on the plurality of semiconductor patterns, wherein each of the plurality of word lines comprises a main gate portion surrounding at least one semiconductor pattern among the plurality of semiconductor patterns, and a connection gate portion disposed between two main gate portions adjacent to each other in the second direction, the connection gate portion being connected to the two main gate portions, wherein an upper surface of the main gate portion and an upper surface of the connection gate portion are coplanar with each other, and wherein an upper surface of each of the plurality of semiconductor patterns is disposed at a lower vertical level than the upper surface of the main gate portion.

2. The semiconductor device of claim 1, wherein, in a plan view, the plurality of semiconductor patterns are arranged in a hexagonal array.

3. The semiconductor device of claim 1, wherein the plurality of word lines have a pitch of 2F in the second direction, each of the plurality of bit lines has a first width of 1.74F in the first direction, and the plurality of bit lines are spaced apart from each other at a first interval of 0.58F in the first direction.

4. The semiconductor device of claim 3, wherein the plurality of semiconductor patterns have a unit cell area of 4.64F2.

5. The semiconductor device of claim 1, wherein, in a plan view, the main gate portion of the first word line is arranged to be offset in the first direction and the second direction from the main gate portion of the second word line.

6. The semiconductor device of claim 1, further comprising a plurality of gate insulating layer structures between the plurality of word lines and the plurality of semiconductor patterns, wherein each of the plurality of gate insulating layer structures comprises:

a first dielectric layer surrounding a sidewall of each of the plurality of semiconductor patterns and having an upper surface at a higher level than the upper surface of each of the plurality of semiconductor patterns; and a second dielectric layer surrounding the sidewall of each of the plurality of semiconductor patterns on the first dielectric layer, and having an upper surface at a lower level than the upper surface of each of the plurality of semiconductor patterns.

7. The semiconductor device of claim 6, wherein the first dielectric layer comprises a silicon oxide, and the second dielectric layer comprises a high-k dielectric material having a greater dielectric constant than the silicon oxide.

8. The semiconductor device of claim 6, further comprising an insulating liner disposed on an upper side of the sidewall of each of the plurality of semiconductor patterns, the insulating liner comprising an air space therein, wherein the air space is arranged between the main gate portion and the first dielectric layer.

9. The semiconductor device of claim 8, wherein each of the plurality of storage nodes comprises:

a lower electrode disposed on upper surfaces of the plurality of semiconductor patterns and extending in a third direction perpendicular to an upper surface of the substrate;

an upper electrode surrounding the lower electrode; and a capacitor dielectric layer located between the lower electrode and the upper electrode, and a bottom surface of the lower electrode is disposed at a lower level than the upper surface of the main gate portion.

10. The semiconductor device of claim 9, wherein a sidewall of a bottom portion of the lower electrode is covered by the insulating liner.

11. A semiconductor device comprising:

a plurality of bit lines each extending in a first direction on a substrate and spaced apart from each other in a second direction perpendicular to the first direction;

a plurality of semiconductor patterns disposed on each of the plurality of bit lines and arranged in a hexagonal array, the plurality of semiconductor patterns comprising:

a plurality of first semiconductor patterns disposed on a first bit line from among the plurality of bit lines and located at a first distance from a first sidewall of the first bit line, and a plurality of second semiconductor patterns located at a second distance that is greater than the first distance from the first sidewall on the first bit line;

a plurality of word lines each extending in the second direction and surrounding a sidewall of each of the plurality of semiconductor patterns;

a plurality of storage nodes respectively disposed on the plurality of semiconductor patterns;

a plurality of gate insulating layer structures located between the plurality of word lines and the plurality of semiconductor patterns; and an insulating liner disposed on an upper side of the sidewall of each of the plurality of semiconductor patterns, the insulating liner comprising an air space therein, wherein each of the plurality of word lines comprises a main gate portion surrounding at least one semiconductor pattern among the plurality of semiconductor patterns, and a connection gate portion disposed between two main gate portions adjacent to each other in the second direction, the connection gate portion being connected to the two main gate portions, and wherein each of the plurality of gate insulating layer structures comprises:

a first dielectric layer surrounding the sidewall of each of the plurality of semiconductor patterns and having an upper surface at a higher level than an upper surface of each of the plurality of semiconductor patterns; and a second dielectric layer surrounding the sidewall of each of the plurality of semiconductor patterns on the first dielectric layer, and having an upper surface at a lower level than the upper surface of each of the plurality of semiconductor patterns.

12. The semiconductor device of claim 11, wherein the plurality of word lines have a pitch of 2F in the second direction, each of the plurality of bit lines has a first width of 1.74F in the first direction, the plurality of bit lines are spaced apart from each other at a first interval of 0.58F in the first direction, and the plurality of semiconductor patterns have a unit cell area of 4.64F2.

13. The semiconductor device of claim 11, wherein the plurality of semiconductor patterns comprise at least one of silicon, silicon-germanium, silicon carbide, gallium arsenide, indium phosphide, indium oxide, indium gallium oxide, indium zinc gallium oxide, and aluminum indium gallium oxide.

14. The semiconductor device of claim 13, wherein the upper surface of the main gate portion and the upper surface of the connection gate portion are coplanar with each other, and the upper surface of each of the plurality of semiconductor patterns is disposed at a lower vertical level than the upper surface of the main gate portion.

15. The semiconductor device of claim 13, wherein each of the plurality of storage nodes comprises:

a lower electrode directly disposed on upper surfaces of the plurality of semiconductor patterns and extending in a third direction perpendicular to an upper surface of the substrate;

an upper electrode surrounding the lower electrode; and a capacitor dielectric layer located between the lower electrode and the upper electrode, a bottom surface of the lower electrode is disposed at a lower level than the upper surface of the main gate portion, and a sidewall of a bottom portion of the lower electrode is covered by the insulating liner.

16. A semiconductor device comprising:

a plurality of bit lines each extending in a first direction on a substrate and spaced apart from each other in a second direction perpendicular to the first direction;

a plurality of semiconductor patterns disposed on each of the plurality of bit lines and arranged in a hexagonal array, the plurality of semiconductor patterns comprising a plurality of first semiconductor patterns disposed on a first bit line from among the plurality of bit lines and located at a first distance from a first sidewall of the first bit line, and a plurality of second semiconductor patterns located at a second distance that is greater than the first distance from the first sidewall on the first bit line;

a plurality of word lines each extending in the second direction and surrounding a sidewall of each of the plurality of semiconductor patterns;

a plurality of gate insulating layer structures located between the plurality of word lines and the plurality of semiconductor patterns;

an insulating liner disposed on an upper side of the sidewall of each of the plurality of semiconductor patterns, the insulating liner comprising an air space therein; and a plurality of storage nodes respectively disposed on the plurality of semiconductor patterns, the plurality of storage nodes comprising a lower electrode, a capacitor dielectric layer, and an upper electrode, wherein a sidewall of a bottom portion of the lower electrode is covered by the insulating liner.

17. The semiconductor device of claim 16, wherein each of the plurality of word lines comprises a main gate portion surrounding at least one semiconductor pattern among the plurality of semiconductor patterns, and a connection gate portion disposed between two main gate portions adjacent to each other in the second direction, the connection gate portion being connected to the two main gate portions, each of the plurality of gate insulating layer structures comprises:

a first dielectric layer surrounding the sidewall of each of the plurality of semiconductor patterns and having an upper surface at a higher level than an upper surface of each of the plurality of semiconductor patterns; and a second dielectric layer surrounding the sidewall of each of the plurality of semiconductor patterns on the first dielectric layer, and having an upper surface at a lower level than the upper surface of each of the plurality of semiconductor patterns, and the insulating liner is located between the main gate portion and the first dielectric layer.

* * * * *